(12) United States Patent
Kimura

(10) Patent No.: US 8,035,103 B2
(45) Date of Patent: Oct. 11, 2011

(54) CIRCUIT BOARD, ELECTRONIC DEVICE, AND METHOD FOR PRODUCING CIRCUIT BOARD

(75) Inventor: Tomohiro Kimura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 317 days.

(21) Appl. No.: 11/988,894

(22) PCT Filed: Jun. 1, 2006

(86) PCT No.: PCT/JP2006/311000
§ 371 (c)(1),
(2), (4) Date: Jan. 16, 2008

(87) PCT Pub. No.: WO2007/017982
PCT Pub. Date: Feb. 15, 2007

(65) Prior Publication Data
US 2009/0250701 A1 Oct. 8, 2009

(30) Foreign Application Priority Data
Aug. 11, 2005 (JP) .................. 2005-233460

(51) Int. Cl.
*H01L 29/10* (2006.01)
(52) U.S. Cl. .................. 257/59; 257/72; 257/E21.214; 257/E21.215; 257/E21.218; 257/E33.053; 438/706; 438/735
(58) Field of Classification Search .................. 257/59, 257/72, E33.053, E21.214, E21.215, E21.218; 438/706, 735, 947
See application file for complete search history.

(56) References Cited

U.S. PATENT DOCUMENTS

| 5,940,732 A | 8/1999 | Zhang |
| 6,015,991 A | 1/2000 | Wheeler et al. |
| 6,228,745 B1 | 5/2001 | Wheeler et al. |
| 6,278,131 B1 | 8/2001 | Yamazaki et al. |
| 6,906,347 B2 | 6/2005 | Yamazaki et al. |
| 7,439,544 B2 * | 10/2008 | Lin et al. .................. 257/72 |
| 2001/0029070 A1 | 10/2001 | Yamazaki et al. |
| 2005/0253148 A1 | 11/2005 | Yamazaki et al. |
| 2005/0287722 A1 | 12/2005 | Zhang |

FOREIGN PATENT DOCUMENTS

JP 64-73769 3/1989

(Continued)

OTHER PUBLICATIONS

International Search Report for PCT/JP2006/311000 mailed Aug. 15, 2006.

*Primary Examiner* — Matthew Landau
*Assistant Examiner* — Jessica Hall
(74) *Attorney, Agent, or Firm* — Nixon & Vanderhye P.C.

(57) ABSTRACT

The present invention provides a circuit board which can improve characteristics of a circuit element, an electronic device, and a method for producing a circuit board. The method for producing a circuit board of the present invention is a method for producing a circuit board including one or more polysilicon layers at the same layer level, wherein the method includes the steps of: forming a photoresist film on the polysilicon layer; forming a photoresist pattern film having side surfaces with different inclination angles by patterning the photoresist film; forming the one or more polysilicon layers having side surfaces with different inclination angles by etching the polysilicon film using the photoresist pattern film.

52 Claims, 11 Drawing Sheets

FOREIGN PATENT DOCUMENTS

| | | |
|---|---|---|
| JP | 5-55165 | 3/1993 |
| JP | 8-153699 | 6/1996 |
| JP | 8-250446 | 9/1996 |
| JP | 9-45793 | 2/1997 |
| JP | 10-256394 | 9/1998 |
| JP | 10-256551 | 9/1998 |
| JP | 2000-101090 | 4/2000 |
| JP | 2000-269511 | 9/2000 |
| JP | 2001-94113 | 4/2001 |
| JP | 2003-289081 | 10/2003 |

* cited by examiner (a)

(b)

(a)

(b)

(c)

(d)

(a)

(b)

(c)

CIRCUIT BOARD, ELECTRONIC DEVICE, AND METHOD FOR PRODUCING CIRCUIT BOARD

This application is the U.S. national phase of International Application No. PCT/JP2006/311000, filed 1 Jun. 2006, which designated the U.S. and claims priority to Japanese Patent Application No. 2005-233460, filed 11 Aug. 2005, the entire contents of each of which are hereby incorporated by reference.

BACKGROUND

Technical Field

The present invention relates to circuit boards, electronic devices, and methods for producing circuit boards. More specifically, the present invention relates to: a circuit board that is preferably used as a component of an electronic device such as a liquid crystal display device, an organic electroluminescent display device, and a solar cell; an electronic device including such a circuit board; and a preferable method for producing a circuit board.

Related Art

A circuit board includes an electronic circuit as a component and has been widely used in various fields. For example, a circuit board including an element such as a thin film transistor (TFT) has been used as a component of an electronic device such as a liquid crystal display device, an organic electroluminescent display device, and a solar cell. Along with progress in production technologies of these electronic devices, production technologies of such a circuit board have been increasingly developed.

A circuit configuration of a TFT array substrate that constitutes a TFT-driven liquid crystal display panel is exemplified below. The TFT array substrate includes a pixel circuit having a structure where a TFT that is a switching element is formed at each intersection of m×n matrix wirings composed of m-scanning lines extending in the row direction and n-signal lines extending in the column direction. A gate electrode of the TFT is connected to the scanning line. A source electrode of the TFT is connected to the signal line. A drain electrode of the TFT is connected to a pixel electrode. Peripheral circuits such as a scanning driver IC and a data driver IC are connected to the scanning line and the signal line, respectively.

However, such a conventional TFT array substrate has room for improvement in that the number of components is increased because the peripheral circuits such as a scanning driver IC and a data driver IC are externally attached to a group of scanning lines, a group of signal lines, and the like, by a Tape Carrier Package (TCP) system and the like.

For this problem, a system liquid crystal technology has been developed along with development of a technology of forming a thin film made of a semiconductor material having a high mobility and formed through a low-temperature process such as polysilicon and continuous grain (CG) silicon. According to this technology, the peripheral circuits such as a scanning driver IC and a data driver IC are integrally formed with the pixel circuit. Therefore, the number of the components can be decreased and further assembly production and examination steps can be reduced. As a result, the costs can be reduced and the reliability can be improved.

The pixel circuits and the peripheral circuits each have a multi-layer structure including functional layers such as a semiconductor layer and a conductive layer and thin films, generally. Each functional layer is formed into a specific pattern and has more excellent fine-processability as the functional layer has a side surface with an inclination angle of near 90°. The thin film that covers the functional layer has more excellent step coverage as the functional layer has a side surface with an inclination angle of near 0°.

According to the above-mentioned TFT array substrate, it is preferable that in TFTs in the peripheral circuit, the semiconductor layer has a side surface with an inclination angle of near 90° because excellent fine-processability and drain current-gate voltage (Id-Vg) characteristics, rather than high step coverage of an insulating film that covers the semiconductor layer, are needed in order to form more finely the TFTs and reduce electric power consumption. In contrast, it is preferable that in storage capacitor part in the pixel circuit, the semiconductor layer has a side surface with a smaller inclination angle because high step coverage of an insulating film that covers the semiconductor layer, rather than excellent fine-processability and Id-Vg characteristics, is needed in order to improve a withstand voltage.

Further, it is preferable that in TFTs in the pixel circuit, the gate electrode has a side surface with an inclination angle of near 90° in order to improve an aperture ratio and line-width controllability. In the peripheral circuit such as a gate driver IC, if the gate electrode has a gently inclined side surface or a step-shaped side surface, a low-concentration impurity region can be automatically prepared in a semiconductor layer below a region where the gate electrode is formed to have a small thickness, through an ion-injecting step, which is effective for improvement in reliability. If the gate electrode constitutes the storage capacitor part, it is preferable that the gate electrode has a side surface with an inclination angle of near 0° in order to improve a withstand voltage.

That is, characteristics needed for the semiconductor layer or the gate electrode, and the film that covers them are different depending on the type of usage of the TFT. Therefore, the preferable inclination angle of the side surface of the semiconductor layer or the gate electrode is also different depending on the type of usage of the TFT.

However, according to production steps using a system liquid crystal technology in which the number of components can be reduced, the semiconductor layer that constitutes the TFT in the peripheral circuit and the semiconductor layer that constitutes the storage capacitor part in the pixel circuit are formed in the same step, and the gate electrode that constitutes the TFT in the peripheral circuit and the gate electrode that constitutes the TFT in the pixel circuit are formed in the same step. Therefore, these semiconductors have substantially the same inclination angle and these gate electrodes have substantially the same inclination angle. Accordingly, if the semiconductor layer that constitutes the TFT in the peripheral circuit is formed to have side surface with an inclination angle of near 90° in order to satisfy characteristics needed for such a semiconductor layer, for example, the insulating film that covers the semiconductor layer can not have high step coverage in the storage capacitor part in the pixel circuit, and therefore the withstand voltage is reduced and leakage between the semiconductor layer and other conductive members is easily caused (the semiconductor layer tends to have the same potential as in other conductive members). In contrast, if the semiconductor layer that constitutes the storage capacitance part in the pixel circuit is formed to have a side surface with a sufficiently reduced inclination angle in order to satisfy the characteristics needed for such a semiconductor layer, the TFTs in the peripheral circuit can not have excellent fine-processability. Further, a threshold voltage is increased, which increases electric power consumption.

That is, the TFT array substrate produced by such a system liquid crystal technology has room for improvement in that at least some of the side surfaces of the semiconductor layers and/or the gate electrodes do not have a preferable inclination angle.

For this problem, the Patent Document 1 discloses a configuration of an active matrix substrate in which a pixel part where a pixel TFT and a storage capacitor are formed and a CMOS circuit including an n-channel TFT and a p-channel TFT are formed in the same substrate. According to this configuration, gate electrodes in each TFT and storage capacitor each have a multi-layer structure including a lower gate electrode (n-silicon film) and an upper gate electrode (Mo—W film). The side surfaces of the upper gate electrodes in each TFT and the storage capacitor have the same inclination angle, and the side surfaces of the lower gate electrodes in the pixel TFT, the storage capacitor, and the n-channel TFT have an inclination angle of 20° and the side surface of the lower gate electrode in the p-channel TFT has an inclination angle of 75°.

However, according to this configuration, the gate electrodes in the pixel TFTs and the storage capacitor formed in the pixel part each have a large channel width, and therefore the size of a shaded region formed in the pixel part is increased. Therefore, such a configuration has room for improvement in that the aperture ratio can not be improved in a transmissive liquid crystal display device, a semi-transmissive liquid crystal display devices, and the like.

TFTs including a layer made of polysilicon and the like generally have a planar structure in which a gate electrode 16a, a source electrode 16b, and a drain electrode 16c are formed on the same side with respect to a polysilicon layer 12, as shown in FIG. 9(c). Such a planar TFT has contact holes 18c and 18d which penetrate a gate insulating film 13 and an interlayer insulating film 14 and connect the silicon layer 12 to the source electrode 16b and the drain electrode 16c.

If such a planar TFT is finely formed in order to be used as a TFT in a peripheral circuit, a distance between the gate electrode 16a, and the contact holes 18c and 18d becomes smaller, which easily causes leakage defects. Further, if the contact holes 18c and 18d are formed to have a side surface with an inclination angle of near 90° in order to reduce such leak defects, the source electrode 16b and the drain electrode 16c can not obtain sufficient step coverage at the circled parts in FIG. 9(d), and thereby disconnection (step cut) easily occurs.

That is, the fine planar TFT has room for improvement in that reduction in the leakage defects and the disconnection can not be simultaneously attained.

Further, a production method of a thin film transistor, which includes a step of crystallizing an island-shaped amorphous silicon layer, is disclosed as a method capable of normalizing a drain current even under a low applied gate voltage by suppressing so-called side-channel effects around the island-shaped amorphous silicon layer (for example, refer to Patent Document 2). A method of forming a step-shaped pattern on a semiconductor substrate, using a mask having a gray-tone mask pattern with partly different transmittances in order not to repeat anion-injecting step, is disclosed (for example, refer to Patent Document 3).

Patent Document 1

Japanese Kokai Publication No. 2001-94113

Patent Document 2

Japanese Kokai Publication No. Hei-08-250446

Patent Document 3

Japanese Kokai Publication No. 2000-101090

DISCLOSURE OF INVENTION

The present invention has been made in view of the above-mentioned state of the art. The present invention has an object to provide a circuit board capable of improving characteristics of a circuit element, and a preferable method for producing a circuit board.

The present inventor made various investigations on a circuit board including one or more semiconductor layers at the same layer level. The inventor noted an inclination of side surfaces of the one or more semiconductor layers at the same layer level. The inventor found that in the circuit board, the inclination needed for the above-mentioned one or more semiconductor layers varies among positions where the side surfaces are disposed inside the circuit. However, in a conventional circuit board, the one or more semiconductor layers at the same layer level have substantially similarly inclined side surfaces, and therefore a circuit element including the above-mentioned one or more semiconductor layers need to be improved in characteristics. Then, the inventor found that if the one or more semiconductor layers at the same layer level have differently inclined side surfaces, the inclination of the side surfaces of the one or more semiconductor layers at the same layer level can be properly adjusted every side surface (according to positions of the side surfaces), and thereby characteristics of the circuit element can be improved. As a result, the above-mentioned problems can be admirably solved, leading to completion of the present invention.

That is, an aspect of the present invention is directed to a circuit board including one or more semiconductor layers at the same layer level, wherein the one or more semiconductor layers have differently inclined side surfaces (hereinafter, also referred to as "first circuit board"). In the present description, the circuit board means a board having a circuit including a circuit element such as a thin film transistor (TFT), a storage capacitor, and a thin film diode (TFD). Examples of such a circuit include a pixel circuit, and a peripheral circuit such as a gate driver IC, a source driver IC, a power supply circuit, an input/output interface circuit, a detection circuit, a compensating circuit, a timing generator, a reference driver, a common electrode (Vcom) driver, a DC-DC converter, and an audio circuit.

The one or more semiconductor layers are included at the same layer level. In the present description, the term "one or more layers at the same layer level" means that the one or more layers can be formed by patterning one film. The above-mentioned one film has a single-layer structure or a multi-layer structure. The term "one or more layers at the same layer level" preferably means that the one or more layers are formed by patterning one film. That is, "one layer at the same layer level" preferably means that one film is patterned to form the one layer, and "two or more layers at the same layer level" preferably means that one film is patterned to form the two or more layers.

It is preferable that the one or more semiconductor layers are formed by patterning one semiconductor film. That is, it is preferable that the one or more semiconductor layers at the same layer level are made of substantially the same material, and that the one or more semiconductor layers at the same layer level have substantially the same characteristics.

Silicon is preferable as a material for the above-mentioned one or more semiconductor layers because of cheap price and mass productivity, and polysilicon, continuous grain (CG) silicon and the like are more preferable because of high mobility. It is preferable that the above-mentioned silicon is crystallized in order to more improve the mobility. The technology for the above-mentioned crystallization is not especially limited, but examples thereof include solid laser crystallization using a continuous wave (CW) laser, sequential lateral solidification (SLS), and selectivity enlarging laser crystallization (SELAX) in which crystal is grown in the lateral direction by pulse-modulated CW laser irradiation.

The one or more semiconductor layers at the same layer level have differently inclined side surfaces at the same layer level. As a result, the inclination of the side surfaces of the one or more semiconductor layers at the same layer level can be properly adjusted every side surface, and thereby characteristics of the circuit element can be improved.

In the present description, the "differently inclined side surfaces" means that the side surfaces of one or more semiconductor layers at the same layer level differ in at least one of a shape and inclination characteristics.

Examples of the shape of the above-mentioned side surface include a substantially planar shape, an upwardly projecting-curved shape, a downwardly projecting-curved shape, and a substantially stepped shape.

If the above-mentioned side surface has a planar shape, the inclination characteristics of the above-mentioned side surface are represented by an angle θ (inclination angle) made by a side surface and a bottom surface of a functional layer (for example, refer to FIG. 10(a)). In this case, the above-mentioned inclination angle θ is uniform in the entire side surface of a functional layer 81, as shown in FIG. 10(a). That is, if the above-mentioned side surface has a planar shape, a line profile of the side surface has a straight line shape when the inclined side surface is viewed from the cross section.

The substantially planar shape is not limited to a planar shape, and includes a shape which can be regarded as a substantially planar shape as long as the shape can be equal to a planar shape from view point of operation and effects of the present invention. Also, if the above-mentioned side surface is a shape which can be regarded as a substantially planar shape, the inclination characteristics of the above-mentioned side surface can be represented by an angle (inclination angle) θ made by the side surface and the bottom surface of the functional layer.

The above-mentioned inclination angle θ may not be uniform in the entire side surface of the functional layer. The side surface of the functional layer may have a shape formed by two or more different substantially planar surfaces with different inclination angles.

Examples of the above-mentioned configuration in which two or more different substantially planar surfaces are combined include: a configuration in which a lower side surface has a substantially planar shape with an inclination angle of θ1 and an upper side surface has a substantially planar shape with an inclination angle of θ2 (θ1>θ2) (cross section with a substantially inverted V shape, refer to FIG. 10(b)); and a configuration in which a lower side surface has a substantially planar shape with an inclination angle of θ1 and an upper side surface has a substantially planar shape with an inclination angle of θ2 (θ1<θ2) (cross section with a substantially V shape, refer to FIG. 10(c)).

If the above-mentioned side surface has an upwardly projecting-curved shape or a downwardly projecting-curved shape, the inclination characteristics of the above-mentioned side surface is represented by a curvature $\chi$ (=1/r) (for example, refer to FIG. 11(a)). In this case, the above-mentioned curvature $\chi$ may be uniform in the entire side surface of the functional layer, as shown in FIGS. 11(a) and (b), or may not be uniform in the entire side surface of the functional layer, as shown in FIGS. 11(c) and 11(d). The above-mentioned configuration in which the curvature $\chi$ is not uniform in the entire side surface of the functional layer is not especially limited. Examples thereof include a configuration in which a line profile of the inclined side surface viewed from the cross section has an ellipse shape (for example, refer to FIG. 11(c)) and a configuration in which a line profile of a lower side surface has a circle shape with a curvature $\chi 1$ and a line profile of an upper side surface has a circle shape with a curvature $\chi 2$ ($\chi 1 \neq \chi 2$) (for example, refer to FIG. 11(d)).

The "side surface has a substantially stepped shape" means that a line profile of the inclined side surface viewed from the cross section has a substantially stepped shape.

If the above-mentioned side surface has a stepped shape and each step has a planar surface, the inclination characteristics of the above-mentioned side surface means that an inclination angle θ, or a value (H/L) calculated by dividing a step height H (a height from the upper surface to the bottom surface of the functional layer) by a length L of the step (a distance from the end of the upper surface to the end of the bottom surface of the functional layer), and the number of the step n (for example, refer to FIG. 12(a), n=3). In this case, the above-mentioned inclination angle θ is uniform in the entire side surface of the functional layer (for example, refer to FIG. 12(a)), but may not be uniform in the entire side surface of the functional layer (for example, refer to FIG. 12(b)). The above-mentioned substantially stepped shape is not limited to a shape in which each step has a planar surface, and include, for example, an upwardly projecting-curved shape and a downwardly projecting-curved shape, and a wave shape (for example, refer to FIG. 12(c)). The substantially stepped shape is not limited to a stepped shape, and includes a shape which can be regarded as a substantially stepped shape as long as the shape can be equal to a stepped shape from view point of the operation and effects of the present invention. Also, if the shape of the above-mentioned side surface is regarded as a substantially stepped shape, the inclination characteristics of the above-mentioned side surface are represented by an inclination angle θ, or a value H/L calculated by dividing a step height H by a length L of the steps, and the number of the step n (for example, refer to FIG. 12(c), n=1).

The first circuit board of the present invention is not especially limited and may or may not include other components as long as the first circuit board essentially includes the above-mentioned one or more semiconductor layers. The differently inclined side surfaces may constitute the same semiconductor layer or may constitute different semiconductor layers as long as the side surfaces are included at the same layer level.

Preferable embodiments of the first circuit board of the present invention are mentioned below in more detail.

It is preferable that at least one of the differently inclined side surfaces has a substantially planar shape. That is, it is preferable that at least one of the side surfaces of the above-mentioned one or more semiconductor layers has a substantially planar shape. According to this configuration, the step coverage of a film covering the one or more semiconductor layers can be more improved by properly adjusting the inclination angle of the side surfaces of the one or more semiconductor layers. In addition, each of the above-mentioned differently inclined side surfaces may have a substantially planar shape, and each of the above-mentioned side surfaces of the one or more semiconductor layers may have a substantially planar shape. According to this configuration, the step coverage of a film covering the one or more semiconductor layers can be more improved. In order for the film covering the one or more semiconductor layers to have high step coverage, it is preferable that the above-mentioned side surfaces of the one or more semiconductor layers have an inclination angle of less than 90°. In order for the one or more semiconductor layers to have fine-processability, it is preferable that the above-mentioned side surfaces of the one or more semiconductor layers have an inclination angle of near 90°.

It is preferable that at least one of the differently inclined side surfaces has a substantially stepped shape. That is, it is preferable that at least one of the above-mentioned side surfaces of the one or more semiconductor layers has a substantially stepped shape. According to this configuration, the line-width controllability of the one or more semiconductor layers and the step coverage of the film covering the one or more semiconductor layers can be more improved by properly adjusting the inclination angle of the side surfaces of the one or more semiconductor layers and the number of the step. In addition, each of the above-mentioned differently inclined side surfaces may have a stepped shape, and each of the above-mentioned side surfaces of the one or more semiconductor layers have a stepped shape. According to this configuration, the line-width controllability of the one or more semiconductor layers and the step coverage of the film covering the one or more semiconductor layers can be further improved.

It is preferable that the one or more semiconductor layers include a first semiconductor layer and a second semiconductor layer; and the first semiconductor layer has a side surface differently inclined from a side surface of the second semiconductor layer. According to this configuration, even if different characteristics are needed between a circuit element including the first semiconductor layer (hereinafter, also referred to as "first circuit element") and a circuit element including the second semiconductor layer that is included at the same layer level as the first semiconductor layer), the inclination of the side surfaces of the semiconductor layers are properly adjusted every semiconductor layer. As a result, characteristics of the first circuit element and those of the second circuit element can be improved. For example, if high step coverage is needed for the film covering the first semiconductor layer in the first circuit element and excellent fine-processability is needed for the second semiconductor layer in the second circuit element, an inclination angle of the side surface of the above-mentioned first semiconductor layer is sufficiently decreased, and an inclination angle of the side surface of the second semiconductor layer is near 90°. As a result, the film covering the first semiconductor layer can obtain high step coverage, and the second semiconductor layer can obtain excellent fine-processability.

According to this configuration, as long as one of the above-mentioned side surfaces of the first semiconductor layer is differently inclined from one of the above-mentioned side surfaces of the second semiconductor layer, all of the side surfaces of the first semiconductor layer may be differently inclined from all side surfaces of the second semiconductor layer. It is preferable that the first semiconductor and the second semiconductor layer are made of the same material.

Further, the first semiconductor layer may have substantially the same bottom area as that of the second semiconductor layer.

In order to more effectively exhibit the operation and effects of the present invention, it is preferable that the first semiconductor layer has a side surface with an inclination angle of 5° or more and 60° or less; the second semiconductor layer has a side surface with an inclination angle of 35° or more and 90° or less; and the inclination angle of the side surface of the first semiconductor layer is smaller than the inclination angle of the side surface of the second semiconductor layer by 20° or more. The lower limit of the above-mentioned inclination angle of the side surface of the first semiconductor layer is more preferably 10° and the upper limit thereof is more preferably 40°. The lower limit of the above-mentioned inclination angle of the side surface of the second semiconductor layer is more preferably 45° and the upper limit thereof is more preferably 85°. The lower limit of the difference in the inclination angle between the side surface of the first semiconductor layer and the side surface of the second semiconductor layer is more preferably 30°.

It is preferable that the first semiconductor layer constitutes a thin film transistor in a peripheral circuit; and the second semiconductor layer constitutes a thin film transistor in a pixel circuit.

According to this configuration, if the side surface of the first semiconductor layer is formed to have a relatively small inclination angle, the step coverage of the film covering the first semiconductor layer can be improved, and therefore the above-mentioned thin film transistor in the peripheral circuit can realize high reliability. In addition to this configuration, if the side surface of the second semiconductor layer that constitutes the thin film transistor in the pixel circuit is formed to have a relatively large inclination angle, a region which is shaded by the semiconductor layer can be reduced. As a result, an aperture ratio can be improved in a transmissive liquid crystal display device, a semi-transmissive liquid crystal display device, and the like.

It is preferable that the first semiconductor layer constitutes a storage capacitor in a pixel circuit; and the second semiconductor layer constitutes a thin film transistor in the pixel circuit or a peripheral circuit. According to this configuration, if the side surface of the first semiconductor layer is formed to have a relatively small inclination angle, the step coverage of the film covering the first semiconductor layer (for example, an insulating film that constitutes the storage capacitor) can be improved. As a result, the above-mentioned storage capacitor in the pixel circuit can obtain a high withstand voltage. In addition to this configuration, if the side surface of the second semiconductor layer in the thin film transistor in the pixel circuit is formed to have a relatively large inclination angle, a region which is shaded by the semiconductor layer can be reduced. As a result, an aperture ratio can be improved in a transmissive liquid crystal display device, a semi-transmissive liquid crystal display device, and the like. If the second semiconductor layer constitutes the thin film transistor in the peripheral circuit, the above-mentioned thin film transistor in the peripheral circuit can be finely formed and realize a low threshold voltage.

It is preferable that the above-mentioned first semiconductor layer that forms the storage capacitor in the pixel circuit is electrically connected to the second semiconductor layer if the above-mentioned second semiconductor layer constitutes a thin film transistor in the pixel circuit. In the present description, it is preferable that the storage capacitor in the pixel circuit is formed by stacking the first semiconductor layer, the gate insulating film, and (if necessary, an interlayer insulating film) the gate electrode or the drain electrode in this order.

In the present description, examples of the configuration of the pixel circuit include a configuration in which a gate wiring, a source wiring, the TFT disposed at an intersection of the gate wiring with the source wiring, and a pixel electrode connected to the TFT are included. A configuration in which a gate driver is included is mentioned as the configuration of the above-mentioned peripheral circuit.

It is preferable that the first semiconductor layer constitutes a thin film transistor in a first peripheral circuit (a first thin film transistor); and the second semiconductor layer constitutes a thin film transistor in a second peripheral circuit (a second thin film transistor). Further, it is preferable that the first semiconductor layer constitutes a first thin film transistor in a peripheral circuit; and the second semiconductor layer constitutes a second thin film transistor in the peripheral circuit. According to these configurations, the first thin film transistor and the second thin film transistor are disposed in different peripheral circuits or the same peripheral circuit. If needed characteristics are different between the first semiconductor layer and the second semiconductor layer, the inclination of the side surfaces of the semiconductor layers are properly adjusted every semiconductor layer, and thereby, the characteristics of both of the first thin film transistor and the second thin film transistor can be improved.

It is preferable that the one or more semiconductor layers include a semiconductor layer having differently inclined side surfaces. According to this configuration, for example, if one side surface of the semiconductor layer is formed to have a sufficiently large inclination angle, the semiconductor layer can be finely formed, and if the other side surface of the semiconductor layer is formed to have a sufficiently small inclination angle, the step coverage of the film covering the semiconductor layer can be improved.

In this configuration, all of the side surfaces of the above-mentioned semiconductor layer may be inclined differently from one another as long as at least one side surface of the semiconductor layer is differently inclined from at least another one side surface of the same semiconductor layer.

In order to effectively exhibit the effective operation and effects of the present invention, it is preferable that the semiconductor layer has a first side surface with an inclination angle of 5° or more and 60° or less and a second side surface with an inclination angle of 35° or more and 90° or less; and the inclination angle of the first side surface is smaller than the inclination angle of the second side surface by 20° or more. The lower limit of the above-mentioned inclination angle of the first side surface is more preferably 10° and the upper limit thereof is more preferably 40°. The lower limit of the above-mentioned inclination angle of the second side surface is more preferably 45° and the upper limit thereof is more preferably 85°. The lower limit of the above-mentioned difference in the inclination angle between the first side surface and the second side surface is more preferably 30°.

It is preferable that the semiconductor layer has a storage capacitor electrode part constituting a storage capacitor in a pixel circuit and a transistor part constituting a thin film transistor; the inclination angle of the side surface of the storage capacitor electrode part is smaller than the inclination angle of the side surface of the transistor part, and it is more preferable that the first side surface is a side surface of the storage capacitor electrode part; and the second side surface is a side surface of the transistor part. According to these configurations, if the side surface of the storage capacitor electrode part is formed to have a relatively small inclination angle, the step coverage of the insulating film covering the storage capacitor electrode part can be improved. Therefore, the above-mentioned storage capacitor in the pixel circuit can realize a high withstand voltage. In addition to this configuration, if the side surface of the transistor part which constitutes the thin film transistor in the pixel circuit is formed to have a relatively large inclination angle, the region which is shaded by the semiconductor layer can be reduced. As a result, an aperture ratio can be improved in a transmissive liquid crystal display device, a semi-transmissive liquid crystal display device, and the like.

The present invention relates to a circuit board including one or more gate electrodes at the same layer level, wherein the one or more gate electrodes include a first gate electrode constituting a thin film transistor in a pixel circuit and a second gate electrode constituting a thin film transistor in a peripheral circuit; and the first gate electrode has a side surface with an inclination angle larger than an inclination angle of a side surface of the second gate electrode (hereinafter, referred to as "second circuit board"). According to the second circuit board of the present invention, the first gate electrode of the thin film transistor in the pixel circuit and the second gate electrode of the thin film transistor in the peripheral circuit are included at the same layer level. Therefore, the first gate electrode and the second gate electrode are formed in the same step. For example, if the first gate electrode is formed to have a side surface with an inclination angle of near 90°, the line-width controllability of the first gate electrode is improved. As a result, the thin film transistor in the pixel circuit can be finely formed. Accordingly, an aperture ratio can be improved if the second circuit board of the present invention is used as a pixel substrate and the like in a transmissive liquid crystal display device or a semi-transmissive liquid crystal display device. In addition to this configuration, if the second gate electrode is formed to have a side surface with a sufficiently small inclination angle, impurity ions are injected into the semiconductor layer of the thin film transistor in the peripheral circuit through the side surface with a small inclination angle. As a result, a region which overlaps with the gate electrode and into which the impurities are doped at a small concentration, a so-called GOLD (gate overlapped lightly doped drain) region can be formed, and therefore, the reliability of the thin film transistor in the peripheral circuit can be easily improved.

According to the second circuit board of the present invention, the step coverage of the film covering the second gate electrode can be improved. If the second gate electrode is formed in the storage capacitor part, for example, leakage defects between the second gate electrode and a conductive layer that is positioned above the second gate electrode with an insulating film therebetween can be reduced (the second gate electrode is prevented from having the same potential as in the conductive layer). That is, it is effective for preparation of a capacitor to dispose an insulating film on the second gate electrode, and thereon, form a conductive layer (metal pattern and the like, formed in the step of forming the gate electrode or the source electrode).

The present invention relates to a circuit board including one or more gate electrodes at the same layer level, wherein the one or more gate electrodes include a first gate electrode constituting a thin film transistor in a pixel circuit or a peripheral circuit and a second gate electrode constituting a storage capacitor in the pixel circuit; and the first gate electrode has a side surface with an inclination angle larger than an inclination angle of a side surface of the second gate electrode (hereinafter, also referred to as "third circuit board"). According to the third circuit board of the present invention, the first gate electrode and the second gate electrode are formed in the same step. If the first gate electrode is formed to have a side surface with a relatively large inclination angle, the line-width controllability of the first gate electrode can be improved. As a result, the region shaded by the semiconductor layer can be reduced if the first gate electrode constitutes the thin film transistor in the pixel circuit. Accordingly, an aperture ratio can be improved in a transmissive liquid crystal display device, a semi-transmissive liquid crystal display device, and the like. Further, if the first gate electrode constitutes a thin film transistor in the peripheral circuit, the above-mentioned thin film transistor in the peripheral circuit can be finely formed. In addition to this configuration, if the second gate electrode is formed to have a side surface with a relatively small inclination angle, the step coverage of the insulating film covering the second gate electrode can be improved. Therefore, the above-mentioned storage capacitor in the pixel circuit can realize a high withstand voltage. In addition, the improvement in the step coverage of the film covering the second gate electrode can reduce the leakage defects between the second gate electrode and a conductive layer that is positioned above the second gate electrode with an insulating film therebetween (the second gate electrode is prevented from having the same potential as in the conductive layer) if the second gate electrode is disposed in the storage capacitor part. That is, the leakage defects between the second gate electrode and a conductive layer that is positioned above the second gate electrode can be reduced (the second gate electrode is prevented from having the same potential as in the conductive layer) even in the case where the conductive layer (a metal pattern and the like, formed in the step of forming another gate electrode or a source electrode) is disposed above the second gate electrode with an insulating film therebetween to form a storage capacitor.

The present invention is also a circuit board including one or more gate electrodes at the same layer level, wherein the one or more gate electrodes include a first gate electrode constituting a thin film transistor in a first peripheral circuit (a first thin film transistor) and a second gate electrode constituting a thin film transistor in a second peripheral circuit (a second thin film transistor); and the first gate electrode has a side surface with an inclination angle larger than an inclination angle of a side surface of the second gate electrode (hereinafter, also referred to as "fourth circuit board").

The present invention is also a circuit board including one or more gate electrodes at the same layer level, wherein the one or more gate electrodes include a first gate electrode constituting a first thin film transistor in a peripheral circuit and a second gate electrode constituting a second thin film transistor in the peripheral circuit; and the first gate electrode has a side surface with an inclination angle larger than an inclination angle of a side surface of the second gate electrode (hereinafter, also referred to as "fifth circuit board").

According to these embodiments, the first thin film transistor and the second thin film transistor are formed in the same or different peripheral circuits. If different characteristics are needed between the first gate electrode and the second gate electrode, the inclination angle of the side surfaces of the gate electrodes are properly adjusted every gate electrode, and thereby the characteristics can be improved in each of the first thin film transistor and the second thin film transistor.

The second to fifth circuit boards of the present invention are not especially limited as long as each of them essentially includes the above-mentioned first and second gate electrodes. The second to fifth circuit boards may or may not include other components. According to these embodiments, at least one side surface of the above-mentioned first gate electrode has an inclination angle larger than an inclination angle of at least one side surface of the second gate electrode. All side surfaces of the first gate electrode may have inclination angles larger than inclination angles of all side surfaces of the second gate electrode.

The preferable embodiments of the second to fifth circuit boards of the present invention are mentioned in more detail below.

It is preferable that the first gate electrode and the second gate electrode, which are included at the same layer level, are made of substantially the same material. It is also preferable that the first gate electrode and the second gate electrode, which are included at the same layer level, have substantially the same characteristics.

It is preferable that the first gate electrode and/or the second gate electrode have/has a side surface of a substantially planar shape. The inclination angle of the side surface of the first gate electrode and/or the second gate electrode can be properly adjusted, and thereby the step coverage of the film covering the first gate electrode and/or the second gate electrode can be more improved. Each side surface of the first gate electrode and the second gate electrode may have a substantially planar shape. In such a case, the step coverage of the film covering the first gate electrode and/or the second gate electrode can be more improved. It is preferable that the side surface of the first gate electrode and/or the second gate electrode has an inclination angle of less than 90° in order for the film covering the first gate electrode and/or the second gate electrode to have high step coverage. Further, it is preferable that the side surface of the first gate electrode and/or the second gate electrode has an inclination angle of near 90° in order for the first gate electrode/and the second gate electrode to have excellent fine-processability.

It is preferable that the first gate electrode and/or the second gate electrode have/has a side surface of a substantially stepped shape. If the inclination characteristics of the side surface of the first gate electrode and/or the second gate electrode, that is, the inclination angle, the value obtained by dividing the step height by the length of the step, and the number of the step are properly adjusted, the line-width controllability of the first gate electrode and/or the second gate electrode, and the step coverage of the film covering the first gate electrode and/or the second gate electrode can be more improved. Each side surface of the first gate electrode and the second gate electrode may have a stepped shape. In such a case, the line-width controllability of the first gate electrode and/or the second gate electrode and the step coverage of the film covering the first gate electrode and/or the second gate electrode can be more improved.

In order to more effectively exhibit the operation and effects of the present invention, it is preferable that the first gate electrode has a side surface with an inclination angle of 50° or more and 90° or less; the second gate electrode has a side surface with an inclination angle of 20° or more and 60° or less; and the inclination angle of the side surface of the first gate electrode is larger than the inclination angle of the side surface of the second gate electrode by 20° or more. The lower limit of the inclination angle of the side surface of the first gate electrode is more preferably 60° and the upper limit thereof is more preferably 90°. The lower limit of the inclination angle of the side surface of the second gate electrode is more preferably 25° and the upper limit thereof is more preferably 45°.

The lower limit of the difference in the inclination angle between the side surface of the first gate electrode and the side surface of the second gate electrode is more preferably 30°.

In the second, fourth, and fifth circuit boards of the present invention, it is preferable that the thin film transistor in the peripheral circuit has a structure in which the semiconductor layer, a gate insulating film, the second gate electrode, an interlayer insulating film, and a source/drain electrode are stacked in this order, and the semiconductor layer is connected to the source electrode and the drain electrode through a contact hole that penetrates the gate insulating film and the interlayer insulating film (so-called planar TFT). According to this configuration, the second gate electrode is formed to have a side surface with a sufficiently small inclination angle, and thereby the step coverage of the film covering the second gate electrode can be improved. As a result, the leakage defects between the second gate electrode and the contact hole can be reduced. In addition, even in the case where a conductive layer is formed above the second gate electrode with an insulating film therebetween to form a capacitor, the leakage defects between the second gate electrode and the conductive layer that is positioned above the second gate electrode can be reduced (the second gate electrode is prevented from having the same potential as in the conductive layer).

The present invention is further a circuit board including one or more gate electrodes at the same layer level, wherein the one or more gate electrodes include a gate electrode having differently inclined side surfaces (hereinafter, also referred to as "sixth circuit board"). According to this configuration, one side surface of the gate electrode is formed to have a sufficiently large inclination angle, and thereby the gate electrode can be finely formed. In addition, the other side surface of the gate electrode (for example, the side surface on the drain side) is formed to have a sufficiently small inclination angle and a GOLD region is formed, and thereby the reliability of the circuit element can be improved.

The sixth circuit board of the present invention is not especially limited as long as it essentially includes the above-mentioned gate electrode. The sixth circuit board may or may not include other components. According to this configuration, at least one side surface of the above-mentioned gate electrode is differently inclined from at least another one side surface of the same gate electrode. All side surfaces of the gate electrode are differently inclined from one another.

In order to effectively exhibit the operation and effects of the present invention, it is preferable that the gate electrode has a first side surface with an inclination angle of 50° or more and 90° or less and a second side surface with an inclination angle of 20° or more and 60° or less; and the inclination angle of the first side surface is larger than the inclination angle of the second side surface by 20° or more. The lower limit of the inclination angle of the first side surface is more preferably 60° and the upper limit thereof is more preferably 90°. The lower limit of the inclination angle of the second side surface is more preferably 25° and the upper limit thereof is more preferably 45°. The lower limit of the difference in the inclination angle between the first side surface and the second side surface is more preferably 30°.

The present invention is also a circuit board including an insulating film having one or more contact holes, wherein the insulating film has differently inclined side surfaces; and the differently inclined side surfaces form the one or more contact holes (hereinafter, also referred to as "seventh circuit board"). According to the seventh circuit board of the present invention, the differently inclined side surfaces of the insulating film form the above-mentioned one or more contact holes, and thereby the side surfaces of the insulating film, constituting the one or more contact holes, are adjusted to have a proper inclination angle. As a result, the characteristics of the circuit element can be improved.

In the present description, the contact hole is an opening of the insulating film, where a conductive film is formed. Through the contact hole, two or more conductive layers which are disposed with the insulating film therebetween are conducted with each other. The above-mentioned two or more conductive layers are not especially limited as long as they show conductivity. The layers may be made of a conductor or a semiconductor. If the above-mentioned contact hole electrically connects the first conductive layer to the second conductive layer, it is preferable that the conductive film in the above-mentioned contact hole is made of substantially the same material as in the first conductive layer or the second conductive layer. The material of the conductive film in the above-mentioned contact hole is preferably a conductor such as a metal.

The seventh circuit board of the present invention is not especially limited as long as it essentially includes the insulating film and the one or more contact holes. The seventh circuit board may or may not include other components. The differently inclined side surfaces of the insulating film may form the same contact hole or different contact holes. The above-mentioned insulating film may have a multi-layer structure. In this case, "the insulating film has differently inclined side surfaces" means that at least one of the layers (insulating layers) constituting the insulating film has differently inclined side surfaces. Further, in this case, "the differently inclined side surfaces form one or more contact holes" means that the differently inclined side surfaces of the insulating layer form the above-mentioned one or more contact holes.

The preferable embodiments of the seventh circuit board of the present invention are mentioned in more detail below.

It is preferable that at least one of the differently inclined side surfaces of the insulating film has a substantially planar shape. It is preferable that at least one side surface of the insulating film, which constitutes the one or more contact holes, has a substantially planar shape. The side surfaces of the insulating film, which constitute the one or more contact holes, are adjusted to have a proper inclination angle, and thereby, the step coverage of the conductive film in the one or more contact holes, which is a film covering the side surfaces of the insulating film, can be more improved.

The "at least one of the differently inclined side surfaces of the insulating film has a substantially planar shape" means that a line profile of the side surface has a substantially straight line shape when the inclined side surface of the insulating film is viewed from the cross section. If the above-mentioned insulating film has a multi-layer structure, the "the side surface of the insulating film has a substantially planar shape" means that the side surface of the insulating film consisting of stacked insulating layers has a substantially planar shape.

Each of the above-mentioned differently inclined side surfaces may have a substantially planar shape. Each of the above-mentioned side surfaces of the insulating film, which constitutes the one or more contact holes, may have a substantially planar shape. As a result, the step coverage of the conductive film in the one or more contact holes can be more improved. It is preferable that the insulating film has a side surface with an inclination angle of less than 90° in order for the conductive film in the contact hole, which is a film covering the side surfaces of the insulating film, to have high step coverage. Further, in order for the contact hole to obtain excellent fine-processability, it is preferable that the insulating film has a side surface with an inclination angle of near 90°.

It is preferable that at least one of the differently inclined side surfaces of the insulating film has a substantially stepped shape. It is preferable that at least one of the side surfaces of the insulating film, which constitutes the one or more contact holes, has a substantially stepped shape. In such a case, the inclination characteristics of the side surfaces of the insulating film, which constitutes the one or more contact holes, that is, the inclination angle, the value obtained by dividing the step height by the length of the step, and the number of the step are appropriately adjusted, and thereby the line-width controllability of the one or more contact holes, and the step coverage of the conductive film in the one or more contact holes can be more improved.

The "at least one of the differently inclined side surfaces of the insulating film has a substantially stepped shape" means that a line profile of the side surface has a substantially stepped shape when the inclined side surface of the insulating film is viewed from the cross section. If the above-mentioned insulating film has a multi-layer structure, the "the side surface of the insulating film has a substantially stepped shape" means that the insulating film consisting of stacked insulating layers has a substantially stepped shape.

Each of the above-mentioned differently inclined side surfaces of the insulating film may have a stepped shape. Each of the side surfaces of the insulating film, which constitute the one or more contact holes, may have a stepped shape. Accordingly, the line-width controllability of the one or more contact holes and the step coverage of the conductive film in the one or more contact holes can be more improved.

It is preferable that the insulating film has a multi-layer structure of insulating layers; steps forming the at least one of the differently inclined side surfaces having a substantially stepped shape are formed by the insulating layers, respectively. If the above-mentioned insulating film has a multi-layer structure of insulating layers, the etching rate can be varied depending on the insulating layers, and therefore, the one or more contact holes can be easily formed to have a side surface with a substantially stepped shape.

It is preferable that the insulating film has a first contact hole and a second contact hole; and the first contact hole is formed by a side surface differently inclined from a side surface forming the second contact hole of the insulating film. According to this configuration, among the side surfaces of the insulating film, the side surface constituting the first contact hole of the insulating film is formed to have an inclination angle of near 90°, and thereby the first contact hole can be finely formed. In addition, the side surface constituting the second contact hole of the insulating film is formed to have an inclination angle of a sufficiently smaller than 90°, and thereby the disconnection (step cut) of the second contact hole can be reduced.

In this configuration, at least one of the side surfaces constituting the first contact hole of the insulating film is differently inclined from at least one of the side surfaces constituting the second contact hole of the insulating film. All of the side surfaces constituting the first contact hole of the insulating film may be differently inclined from all of the side surfaces constituting the second contact hole of the insulating film.

It is preferable that the one or more contact holes include a contact hole formed by the differently inclined side surfaces of the insulating film. According to this configuration, among the side surfaces of the insulating film, a side surface constituting a part of the above-mentioned contact hole of the insulating film is formed to have an inclination angle of near 90°. As a result, the contact hole can be finely formed. In addition to this configuration, among the side surfaces of the insulating film, a side surface which constitutes the above-mentioned contact hole and is positioned on the side where leakage defects are not concerned, of the insulating film, is formed to have a sufficiently reduced inclination angle, and thereby the disconnection (step cut) can be reduced.

According to the above-mentioned seventh circuit board, it is preferable that the circuit board includes a thin film transistor; and the contact hole is formed between a semiconductor layer of the thin film transistor and a source electrode or a drain electrode of the thin film transistor. According to this configuration, the contact hole can be finely formed, and the step cut can be reduced. Therefore, the thin film transistor can be finely formed and the reliability can be improved.

In order to effectively exhibit the operation and effects of the present invention, it is preferable that the contact hole has a first side surface with an inclination angle of 20° or more and 70° or less and a second side surface with an inclination angle of 40° or more and 90° or less; and the inclination angle of the first side surface is smaller than the inclination angle of the second side surface by 20° or more. The lower limit of the inclination angle of the first side surface is more preferably 30° and the upper limit thereof is more preferably 60°. The lower limit of the inclination angle of the second side surface is more preferably 50° and the upper limit thereof is more preferably 85°.

The lower limit of the difference in the inclination angle between the first side surface and the second side surface is more preferably 25°.

The present invention is also an electronic device including any of the first to seventh circuit boards. According to this electronic device, characteristics of a circuit element can be improved, and therefore an electronic device with high performances can be provided. Examples of the above-mentioned electronic device include a liquid crystal display device, an organic electroluminescent display device, and a solar cell.

It is preferable that the electronic device is a liquid crystal display device. According to this liquid crystal display device, characteristics of a circuit element can be improved, and therefore a liquid crystal display device with high performances can be provided. Preferable examples of the above-mentioned liquid crystal display device include a liquid crystal display device including a circuit board obtained by forming a pixel circuit including gate wirings, source wirings, and thin film transistors each disposed at intersections of the gate wirings with the source wirings and a peripheral circuit including thin film transistors on a substrate. According to this configuration (so-called system liquid crystal), an area where the peripheral circuit is mounted or externally attached is reduced, and thereby the size and the thickness of the liquid crystal display device can be reduced, and the reliability can be also improved.

It is preferable that the electronic device is an organic electroluminescent display device. According to this organic electroluminescent display device, characteristics of a circuit element can be improved, and therefore an organic electroluminescent display device with high performances can be provided. Preferable configurations of the above-mentioned organic electroluminescent display device include an organic electroluminescent display device including a circuit board obtained by forming a pixel circuit including gate wirings, source wirings, and thin film transistors each disposed at intersections of the gate wirings with the source wirings and a peripheral circuit including thin film transistors on a substrate. According to this configuration, an area where the peripheral circuit is mounted or externally attached is reduced, and thereby the size and the thickness of the organic electroluminescent display device can be reduced, and the reliability can be also improved.

The present invention is also a method for producing a circuit board including one or more functional layers at the same layer level, the method including the steps of: forming one or more covering pattern films having differently inclined side surfaces on a functional film (covering pattern film-forming step); and forming the one or more functional layers by etching the functional film (functional layer-forming step). According to such a method for producing a circuit board of the present invention, one or more functional layers having differently inclined side surfaces can be simply formed at the same layer level. That is, a circuit board including such one or more functional layers can be simply produced.

It is preferable that the differently inclined side surfaces of the one or more functional layers are formed through one-time photoetching step in view of simplification of the production steps. However, the side surfaces may be formed through two or more-times photoetching steps.

The above-mentioned one or more functional layers are not especially limited as long as they are essential components of the above-mentioned circuit element, but preferably contain a material which exhibits functions using an electrical property. Examples thereof include a semiconductor layer in a TFT, a gate electrode, and an insulating film having one or more contact holes. Materials that show reactivity to etchant (reactive gas or etching liquid) used in the above-mentioned functional layer-forming step are preferable as a material for the above-mentioned one or more covering pattern films. Materials that react with the etchant to be faceted in the above-mentioned functional layer-forming step are more preferable. For example, a photoresist, an insulating material, a conductive material, and a semiconductor material are mentioned. Further, the cross sectional shape of the side surfaces of the above-mentioned one or more covering pattern films is not limited as long as the operation and effects of the present invention are exhibited. Examples thereof include a substantially planar shape, a cross sectional substantially V shape, across sectional substantially inverted V shape, an upwardly projecting-curved shape, a downwardly projecting-curved shape, and a substantially stepped shape. The above-mentioned one or more covering pattern films may have a single-layer structure or a multi-layer structure.

The method for producing the circuit board of the present invention is not especially limited as long as it essentially includes the above-mentioned covering pattern film-forming step and the above-mentioned functional layer-forming step. The method may or may not include other steps. The method for producing the circuit board of the present invention may or may not include a step of removing the one or more covering pattern films.

It is preferable that the step of forming the one or more functional layers is performed using the one or more covering pattern films. According to this production method, the one or more functional layers having differently inclined side surfaces can be more simply formed at the same layer level using the difference in inclination of the side surfaces of the one or more covering pattern films. That is, a circuit board including such one or more functional layers at the same layer level can be more simply produced.

It is preferable that the one or more covering pattern films include a first covering pattern film and a second covering pattern film; and the first covering pattern film has a side surface differently inclined from a side surface of the second covering pattern film. As a result, the first covering pattern film and the second covering pattern film having a side surface differently inclined from a side surface of the first covering pattern film can be formed in the same step. Therefore, the production steps can be simplified in comparison to a method of forming the first covering pattern film and the second covering pattern film separately in different steps. The above-mentioned first covering pattern film has a side surface differently inclined from a side surface of the second covering pattern film. Therefore, according to the above-mentioned functional film-forming step, the first functional layer and the second functional layer having a side surface differently inclined from a side surface of the first functional layer can be simply formed.

It is preferable that the one or more covering pattern films include a covering pattern film having differently inclined side surfaces. As a result, the covering pattern film having differently inclined side surfaces can be formed in the same step. Therefore, the production steps can be simplified in comparison to a method of forming the differently inclined side surfaces separately in different steps. The covering pattern film has differently inclined side surfaces, and therefore according to the above-mentioned functional layer-forming step, the one or more functional layers having differently inclined side surfaces can be simply formed. That is, a circuit board including such functional layers can be simply produced.

It is preferable that the step of forming the one or more covering pattern films includes one-time exposure for a photoresist film through a mask. If the patterning is performed by one-time exposure treatment using a photoresist film as a covering film, one or more photoresist pattern films having differently inclined side surfaces can be simply formed at the same layer level. Further, the functional film is etched using the one or more photoresist pattern films having differently inclined side surfaces, and thereby the one or more functional layers having differently inclined side surfaces can be more simply formed at the same layer level. Further, according to this production method, the inclination of the side surfaces constituting the one or more functional layers can be more precisely controlled regardless of the area of the one or more functional layers and the material for the one or more photoresist pattern films and the like. As mentioned above, the differently inclined side surfaces, which constitute the one or more photoresist pattern films, are preferably formed by one-time exposure in view of simplification of the production methods. However, the differently inclined side surfaces may be formed by two or more-times exposure.

If the above-mentioned one-time exposure treatment is performed by a common surface exposure method, it is preferable that the photoresist film is made of a positive photoresist so that the side surface of the one or more covering pattern films has an inclination angle of more than 0° and 90° or less. If the above-mentioned one-time exposure treatment is performed using a back-surface exposure method, it is preferable that the above-mentioned photoresist film is made of a negative photoresist so that the side surface of the one or more covering pattern films has an inclination angle of more than 0° and 90° or less. Further, it is preferable that the above-mentioned one time exposure treatment is performed using a stepping projection aligner, a proximity aligner, or a contact aligner, for example. It is preferable that the step of forming the one or more covering pattern films includes: developing the photoresist film subjected to the above-mentioned one-time exposure treatment; baking the photoresist film subjected to the above-mentioned development treatment; and/or washing the photoresist film subjected to the above-mentioned baking treatment.

It is preferable that the mask includes a transmissive part, a shaded part, and an exposure control part; and the exposure control part is disposed between the transmissive part and the shaded part. The mask includes the exposure control part, and therefore the inclination of the side surfaces of the one or more photoresist pattern films can be simply controlled by controlling the structure of the above-mentioned exposure control part. In addition, the exposure control part is disposed between the transmissive part and the shaded part, and therefore, the one or more photoresist pattern films having inclined side surfaces that are different between a region where the exposure control part is disposed and a transmissive part-shaded part boundary region can be formed. The above-mentioned exposure control part has a region with different transmittances.

The transmittance in the exposure control part is smaller than the transmittance in the transmissive part having the same plane areas as that of the exposure control part. Further, the transmittance in the exposure control part is larger than the transmittance in the shaded part having the same plane area as that of the exposure control part. It is preferable that the exposure control part has a structure in which the transmittance decreases continuously or discontinuously from the transmissive part to the shaded part. As a result, if the above-mentioned photoresist film is made of a positive photoresist, the one or more functional layers can be formed to have a side surface with an inclination angle of less than 90° and therefore the step coverage of the film covering the one or more functional layers can be secured to some extent. Further, examples of the above-mentioned structure in which the transmittance decreases discontinuously from the transmissive part to the shaded part include a structure in which a plurality of openings are arranged in lines and the area of the openings decreases from the transmissive part to the shaded part.

It is preferable that the step of forming the one or more functional layers is performed by dry etching. As a result, the inclination of the side surfaces of the one or more functional layers can be precisely controlled. A mixed gas of sulfur hexafluoride ($SF_6$) gas with oxygen ($O_2$) gas may be mentioned as a dry etching gas, for example, if the functional film is made of silicon (Si).

According to one or more aspects of the present invention, the inclination of the side surfaces of the one or more functional layers at the same layer level, such as a semiconductor layer, a gate electrode, and an insulating film having a contact hole can be adjusted every side surface, and therefore characteristics of the circuit element can be improved.

DETAILED DESCRIPTION OF THE INVENTION

The present invention is mentioned in more detail below with reference to Embodiments, but the present invention is not limited to only these Embodiments.

Embodiment 1

FIGS. 1(a) to 1(d) are cross-sectional views schematically showing production steps of an active matrix substrate in a transmissive liquid crystal display device in accordance with Embodiment 1 of the present invention.

In the present Embodiment, a method of forming a TFT in a pixel circuit part, a storage capacitor (Cs) part, and a TFT in a driver IC part is mentioned with reference to FIGS. 1(a) to 1(d).

Figure 1:
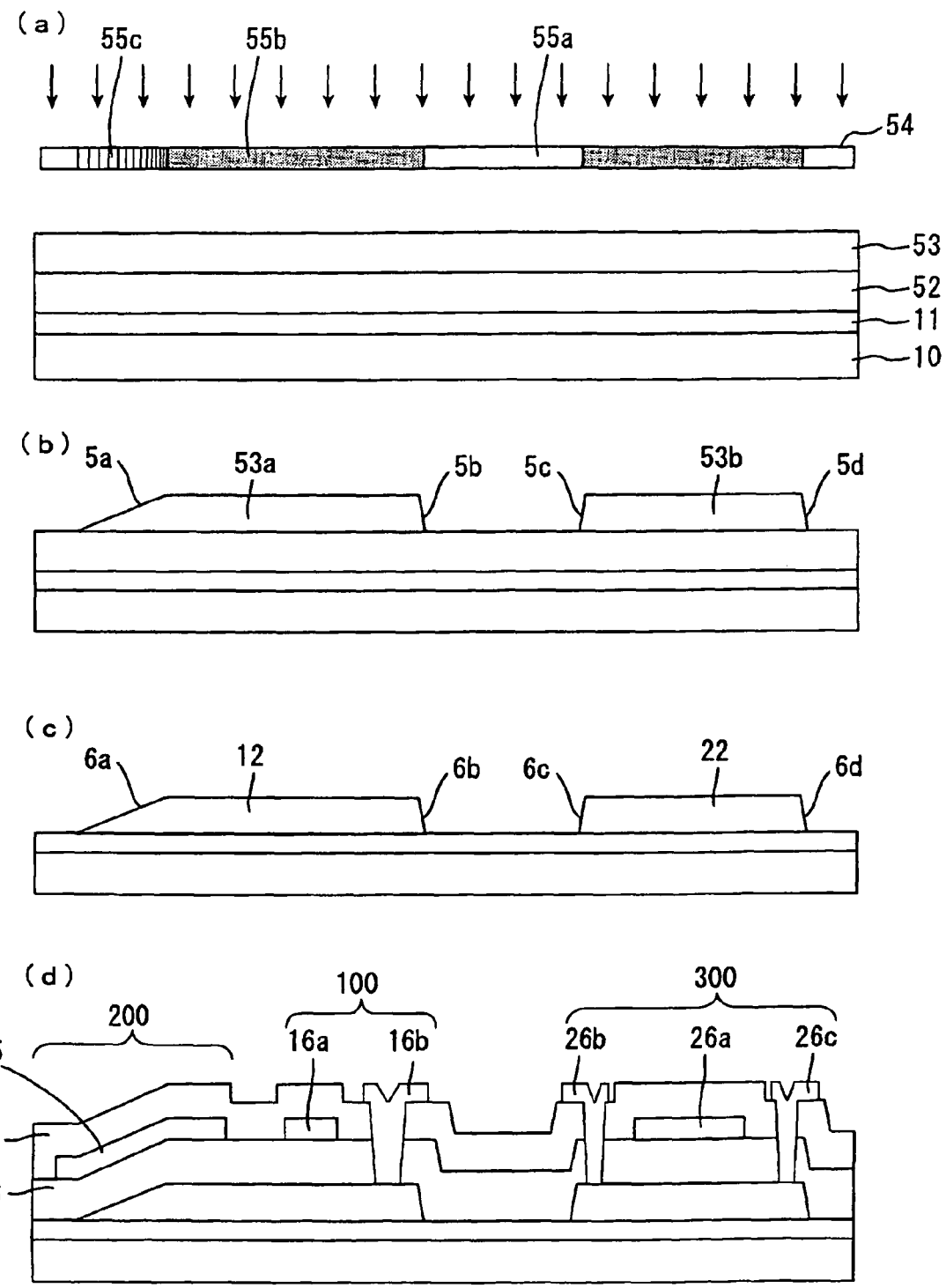
FIGS. 1(a) to 1(d) are cross-sectional views schematically showing the production steps of the active matrix substrate in accordance with Embodiment 1 of the present invention.

First, as shown in FIG. 1(a), a base coat film 11, a polysilicon film (functional film) 52, and a photoresist film 53 are successively formed on a glass substrate 10. In the present Embodiment, a positive photoresist is used as a material for the photoresist film 53. The photoresist film 53 is exposed through a mask 54. In the present Embodiment, a mask having a transmissive part 55a, a shaded part 55b, and a gray tone part (exposure control part) 55c is used as the mask 54.

Figure 2:
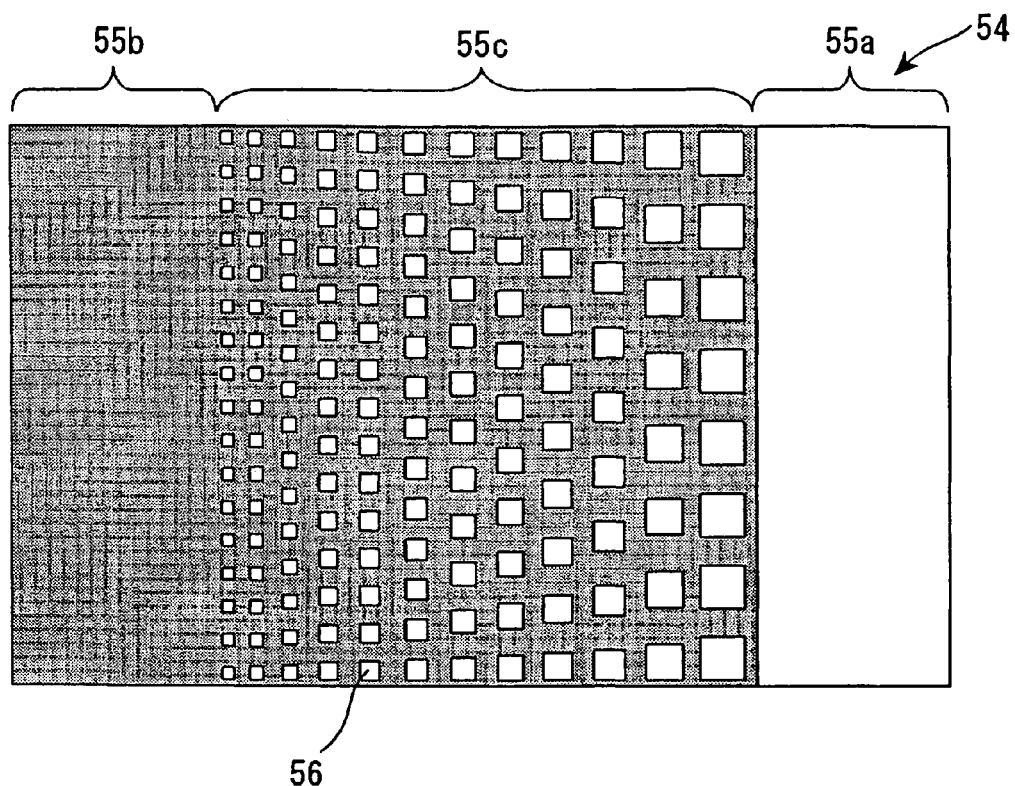
FIG. 2 is a planar view schematically showing a configuration of the mask 54 (Embodiment 1).

FIG. 2 is a planar view schematically showing a configuration of the mask 54.

As shown in FIG. 2, the gray tone part 55c has a plurality of openings 56 arranged in lines and the area of the openings 56 decreases from the transmissive part 55a to the shaded part 55b. The exposure is performed and then development is performed. As a result, as shown in FIG. 1(b), a first photoresist pattern film (a first covering pattern film) 53a having a substantially planar side surface 5a with an inclination angle of 40° and a substantially planar side surface 5b with an inclination angle of 80° and a second photoresist pattern film (a second covering pattern film) 53b having substantially planar side surfaces 5c and 5d each with an inclination angle of 80° can be formed on the polysilicon film 52.

Figure 3:
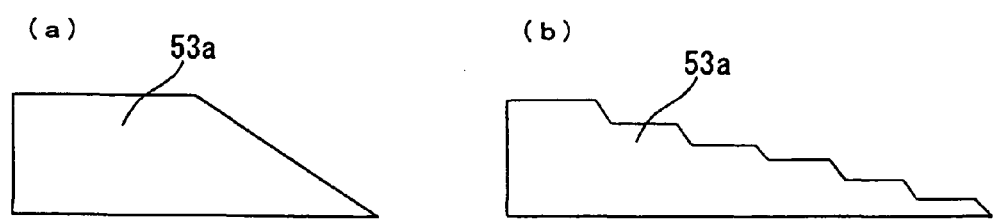
FIG. 3(a) is a cross-sectional view schematically showing a shape of a side surface of the first photoresist pattern 53a and FIG. 3(b) is a cross-sectional view schematically showing a modified example of the shape.

FIG. 3(a) is a cross-sectional view schematically showing the shape of the side surface 5a of the first photoresist pattern film 53a.

In the present Embodiment, the first photoresist pattern film 53a is formed to have a substantially planar side surface 5a, as shown in FIG. 3(a).

However, a stepped side surface 5a may be formed by changing the structure of the exposure control part 55c of the mask 54 as shown in FIG. 3(b), for example.

Then, the polysilicon film 52 is etched using the first photoresist pattern film 53a and the second photoresist pattern film 53b as a mask. In the present Embodiment, a mixed gas of sulfur hexafluoride ($SF_6$) gas with oxygen ($O_2$) gas is used as an etching gas. The etching of the polysilicon film 52 retreats the first photoresist pattern film 53a and the second photoresist pattern film 53b. The side surfaces 5a to 5d have the same (substantially planar) shape, but the side surface 5a has an inclination angle different from inclination angles of the side surfaces 5b to 5d. After this etching, a polysilicon layer (a first functional layer) 12 having side surfaces 6a and 6b and a polysilicon layer (a second functional layer) 22 having side surfaces 6c and 6d are formed, as shown in FIG. 1(c). The side surfaces 6a to 6d have the same (substantially planar) shape, but the side surface 6a has a different inclination angle from inclination angles of the side surfaces 6b to 6d. In the present Embodiment, the side surfaces 6a and 6b of the polysilicon layer 12 are formed to have inclination angles of 20° and 70°, respectively. Further, the side surfaces 6c and 6d of the polysilicon layer 22 are formed to have inclination angles of 70°, respectively.

Then, as shown in FIG. 1(d), a gate insulating film 13, gate electrodes 16a and 26a, a storage capacitance wiring 15, a first interlayer insulating film 14, source electrodes 16b and 26b, a drain electrode 26c are formed. As a result, a TFT 100 in a pixel circuit part, a Cs part 200, and a TFT 300 in a driver IC part can be formed.

Then, a second interlayer insulating film is formed over the entire substrate and patterned. As a result, an opening is formed above the drain electrode in the TFT 100 in order to bring the drain electrode into contact with a pixel electrode (not shown).

Then, an indium tin oxide (ITO) film is formed on the second interlayer insulating film by sputtering. As a result, the ITO film contacts with the drain electrode of the TFT 100 through the opening of the second interlayer insulating film (not shown).

Finally, the ITO film is patterned by photoetching, and thereby a pixel electrode is formed (not shown).

In the present Embodiment, the side surface 6a of the polysilicon layer 12 has a substantially planar shape and has an inclination angle of 20°, and therefore the gate insulating film 13 that covers the polysilicon layer 12 can obtain high step coverage. As a result, the Cs part 200 can obtain a high withstand voltage. Further, the side surface 6b of the polysilicon layer 12 has an inclination angle of 80°, and therefore the TFT 100 in the pixel circuit part can be finely formed. As a result, an aperture ratio can be improved. Further, each of the side surfaces 6c and 6d of the polysilicon layer 22 has an inclination angle of 70°, and therefore the TFT 300 in the driver IC part can obtain precipitous drain current-gate voltage characteristics (Id-Vg characteristics). As a result, excellent element characteristics can be obtained. In the present Embodiment, the pixel circuit part and the driver IC part are formed on the same substrate, and therefore the number of the components can be more reduced in comparison to the configuration in which they are separately formed on different substrates.

Embodiment 2

Figure 4:
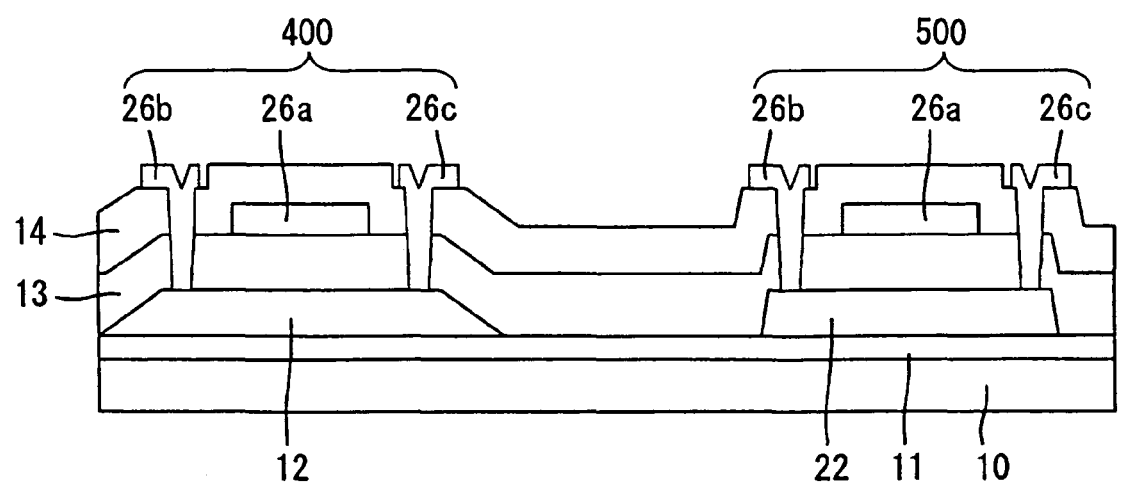
FIG. 4 is a cross-sectional view schematically showing a configuration of the thin film transistor substrate in accordance with Embodiment 2.
Figure 5:
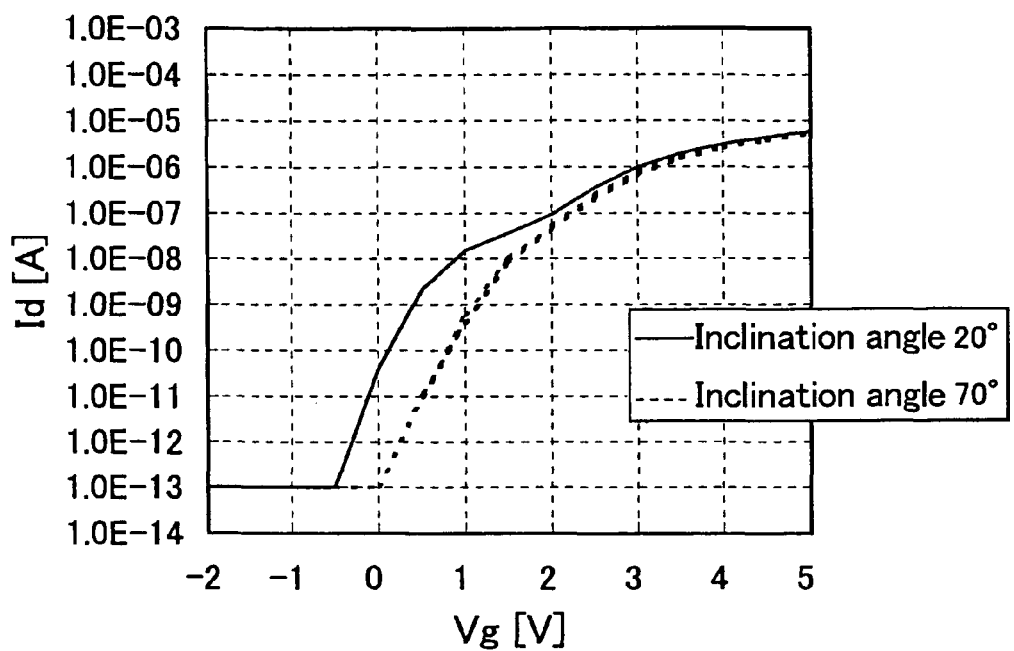
FIG. 5(a) is a graph showing measurement results of drain current-gate voltage (Id-Vg) characteristics and FIG. 5(b) is a graph showing measurement results of s gate withstand voltage (Embodiment 2).
Figure 5:
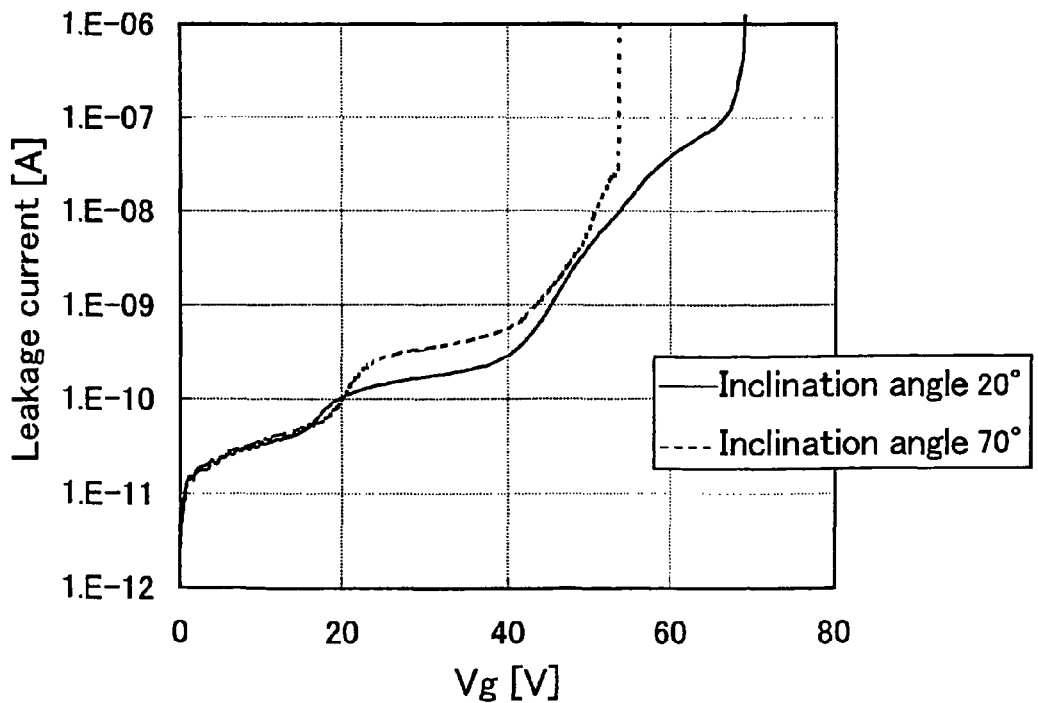

In the present Embodiment, TFTs 400 and 500 are formed by the same production method as in Embodiment 1, as shown in FIG. 4. The TFTs 400 and 500 have the same configuration except that the polysilicon layer 12 has side surfaces with an inclination angle of 20° and the polysilicon layer 22 has side surfaces with an inclination angle of 70°. Then, the TFTs 400 and 500 are measured for the Id-Vg characteristics and the withstand voltage. FIGS. 5(a) and (b) show the results. With respect to the measurement of the Id-Vg characteristics, a drain voltage is 0.1V, and a channel length (L) of the TFT is 4 micrometers and a channel width (W) thereof is 20 micrometers.

The polysilicon layer 12 have side surfaces with an inclination angle of 20°, and therefore the gate insulating film 13 which covers the polysilicon layer 12 can obtain high step coverage. As a result, the TFT 400 can obtain a high withstand voltage, as shown in FIG. 5(a). In addition, the polysilicon layer 22 has side surfaces with an inclination angle of 70°, and therefore the TFT 500 can obtain a low threshold voltage, as shown in FIG. 5(b).

Embodiment 3

Figure 6:
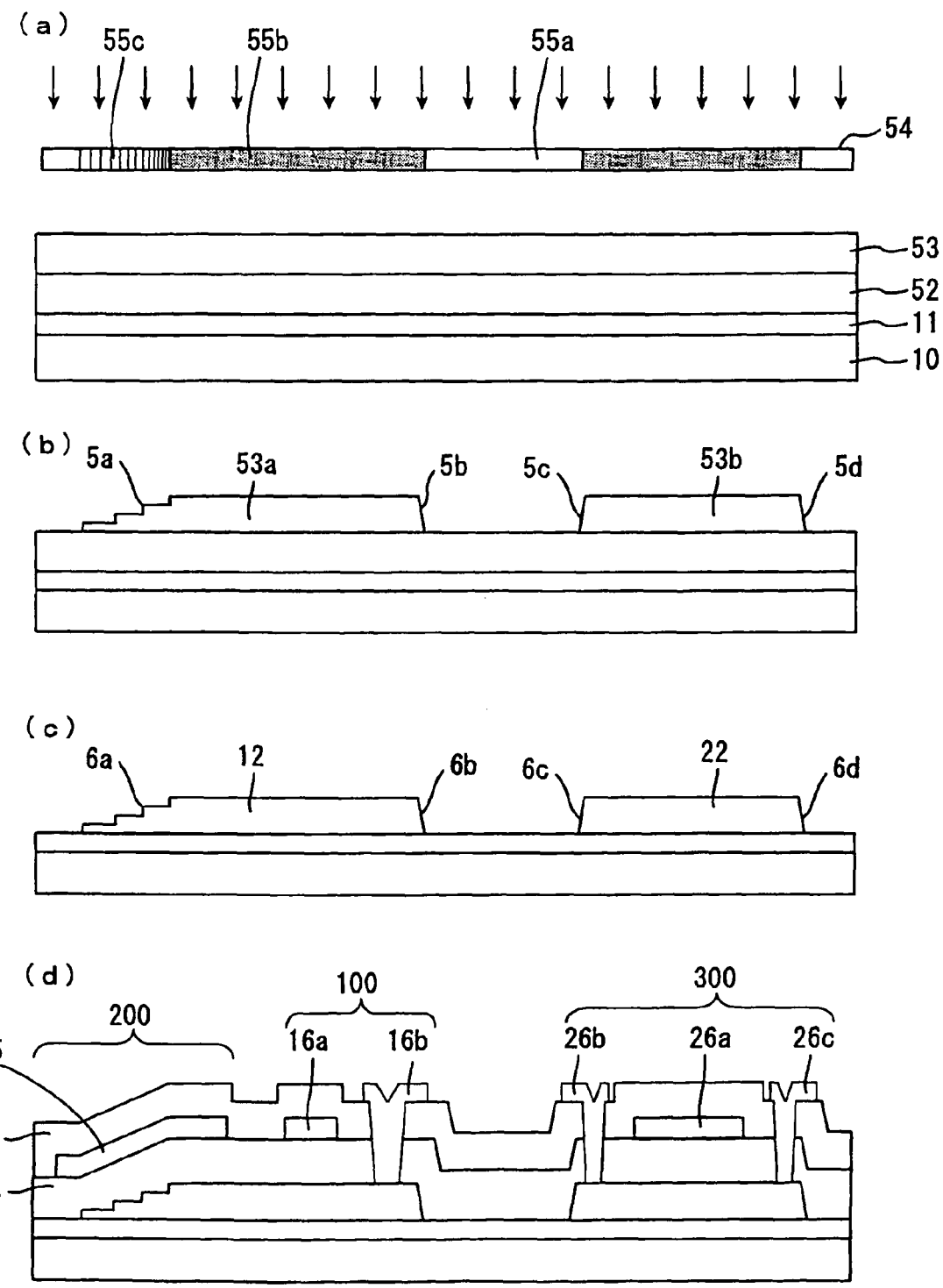
FIGS. 6(a) to 6(d) are cross-sectional views schematically showing production steps of the active matrix substrate in the transmissive liquid crystal display device in accordance with Embodiment 3 of the present invention.

FIGS. 6(a) to 6(d) are cross-sectional views schematically showing production steps of an active matrix substrate in a transmissive liquid crystal display device in accordance with Embodiment 3 of the present invention. The present Embodiment is the same as in Embodiment 1, except that a first photoresist pattern film 53a has a side surface 5a with a substantially stepped shape (a value calculated by dividing a step height by a length of the step: 0.7, the number of the step: 3), as shown in FIG. 6(b) and that using the first photoresist pattern film, the polysilicon layer 12 has a side surface 6a with a substantially stepped shape (a value calculated by dividing a step height by a length of the step: 0.5, the number of the step: 3), as shown in FIG. 6(c).

In the present Embodiment, the polysilicon layer 12 has a substantially stepped side surface 6a whose value calculated by dividing the step height by the length of the step is 0.5, and the side surface 6b has an inclination angle of 70°. Therefore, the polysilicon layer 12 can obtain high line-width controllability. As a result, the plane areas of the TFT 100 in the pixel circuit part and the Cs part 200 can be reduced and the aperture ratio can be improved. The gate insulating film 13 that covers the polysilicon layer 12 can obtain high step coverage in the Cs part 200, and therefore the Cs part 200 can obtain a high withstand voltage. Further, also in the present Embodiment, the polysilicon layer 22 has a substantially planar side surface with an inclination angle of 70°, and therefore the TFT 300 in the driver IC part can obtain high reliability. Also in the present Embodiment, the pixel circuit part and the driver IC part are formed on the same substrate, and therefore the number of the components can be more reduced in comparison to the configuration in which they are separately formed on different substrates.

Embodiment 4

FIGS. 7(a) to 7(d) are cross-sectional views schematically showing production steps of an active matrix substrate of a transmissive liquid crystal display device in accordance with Embodiment 4 of the present invention.

In the present Embodiment, a method of forming an n-channel TFT having a normal structure in a pixel circuit part and an n-channel TFT having a GOLD (gate overlapped lightly doped drain) structure in a driver IC part is mentioned with reference to FIGS. 7(a) to 7(d).

Figure 7:
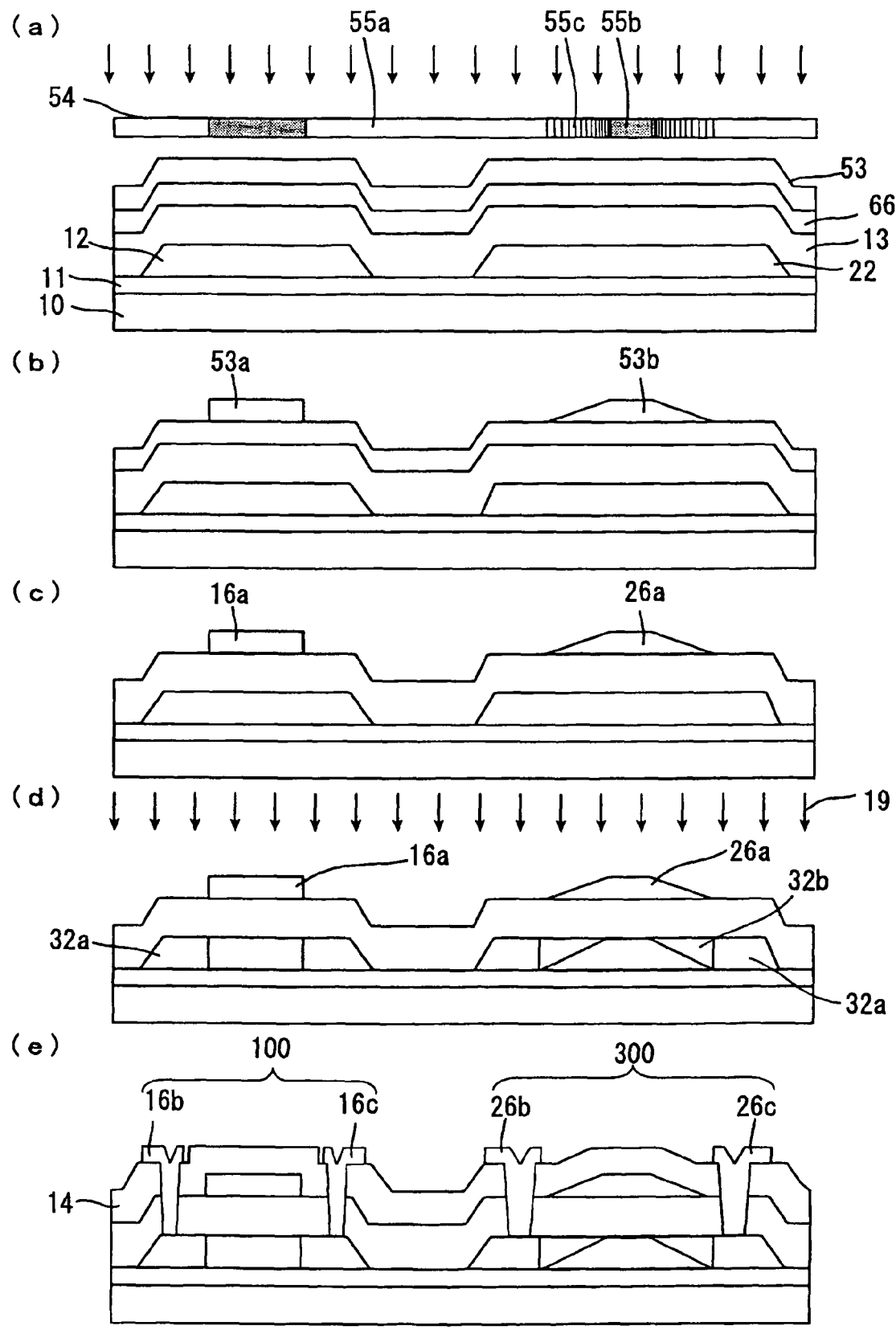
FIGS. 7(a) to 7(e) are cross-sectional views schematically showing production steps of the active matrix substrate in the transmissive liquid crystal display device in accordance with Embodiment 4 of the present invention.

First, as shown in FIG. 7(a), a base coat film 11, polysilicon layers 12 and 22, a gate insulating film 13, a metal film (functional film) 66 and a photoresist film 53 are successively formed on a glass substrate 10. In the present Embodiment, a stacked metal film including a tungsten (W) film as an upper layer and a tantalum nitride (TaN) film as a lower layer is used as the metal film 66. A positive photoresist is used as a material for the photoresist material 53.

Then, the photoresist film 53 is exposed through a mask 54 having a transmissive part 55a, a shaded part 55b, and a gray tone part (exposure control part) 55c and then is developed. As a result, as shown in FIG. 7(b), a first photoresist pattern film (a first covering pattern film) 53a having side surfaces with an inclination angle of 85° and a second photoresist pattern film (a second covering pattern film) 53b having side surfaces with an inclination angle of 50° are formed.

Then, the metal film 66 is etched using the first photoresist pattern film 53a and the second photoresist pattern film 53b as a mask. In the present Embodiment, a mixed gas of sulfur hexafluoride (SF$_6$) gas and oxygen (O$_2$) gas is used as an etching gas. The etching of the metal film 66 retreats the first photoresist pattern film 53a and the second photoresist pattern film 53b. As a result, as shown in FIG. 7(c), a gate electrode (a first functional layer) 16a having side surfaces with an inclination angle of 85° and a gate electrode (a second functional layer) 26a having side surfaces with an inclination angle of 45° can be simultaneously formed.

Then, as shown in FIG. 7(d), n-type impurity ions 19 are injected into the semiconductor layers 12 and 22. In the present Embodiment, a phosphorus ion is used as the n-type impurity ion 19 to form the n-channel TFT. However, a boron ion and the like is used as a p-type impurity ion if a p-channel TFT is formed. When the n-type impurity ions 19 are injected, some of the n-type impurity ions 19 pass through the inclined part of the gate electrode 26a in accordance with the film thickness at the inclined part. As a result, a n-type high concentration impurity region 32a can be formed in the semiconductor layers 12 and 22, and further, a GOLD region 32b containing the n-type impurity ions at a low concentration can be formed in the semiconductor layer 22. The concentration gradient of the impurity ions 19 in the GOLD region 32b has a profile which reflects the inclination of the gate electrode 26a, as shown in FIG. 7(d).

Finally, as shown in FIG. 7(e), an interlayer insulating film 14, source electrodes 16b and 26b, and drain electrodes 16c and 26c are formed. As a result, an n-channel TFT having a normal structure is formed in the pixel circuit part, and an n-channel TFT having a GOLD structure can be formed in the driver IC part.

In the present Embodiment, the gate electrode 16a has substantially planar side surfaces with an inclination angle of 85°, and therefore the gate electrode 16a can obtain high line-width controllability. As a result, a planar area of the TFT 100 in the pixel circuit part can be reduced, and an aperture ratio can be improved. In addition, the gate electrode 26a has substantially planar side surfaces with an inclination angle of 45°, and therefore the interlayer insulating layer 14 that covers the gate electrode 26a can obtain high step coverage. As a result, the TFT 300 in the driver IC part can obtain high reliability. Further, in the present Embodiment, the pixel circuit and the driver IC are formed on the same substrate, and therefore the number of the components can be more reduced in comparison to the configuration in which they are separately formed on different substrates. The present invention is not limited to Embodiment 4, and may be applied to case where n-channel and p-channel TFTs having a LDD structure and p-channel TFTs having a GOLD structure, and the like are formed on the same substrate.

Embodiment 5

FIGS. 8(a) to 8(d) are cross-sectional views schematically showing production steps of an active matrix substrate in accordance with Embodiment 5 of the present invention.

In the present Embodiment, a method of forming a TFT is mentioned with reference to FIGS. 8(a) to 8(d).

Figure 8:
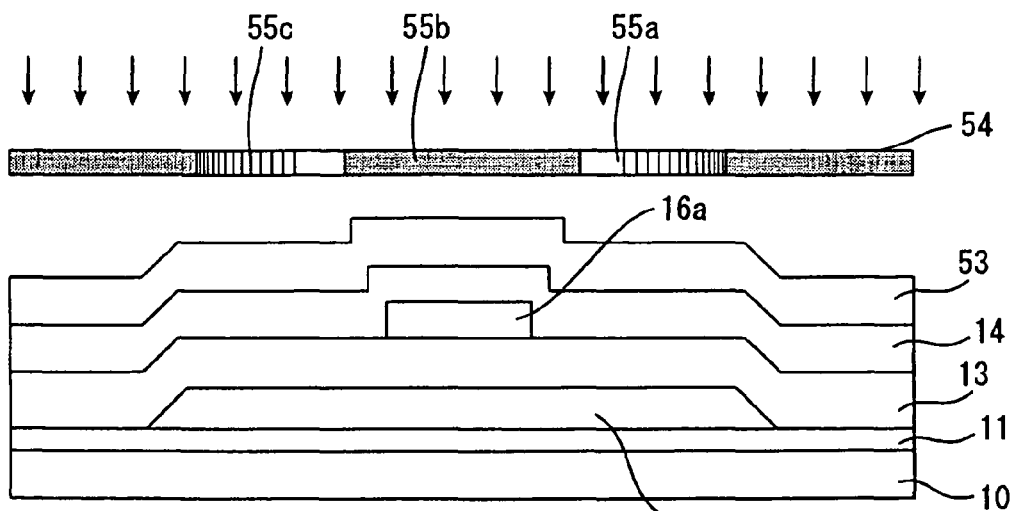
FIGS. 8(a) to 8(d) are cross-sectional views schematically showing production steps of the active matrix substrate in accordance with Embodiment 5 of the present invention.
Figure 8:
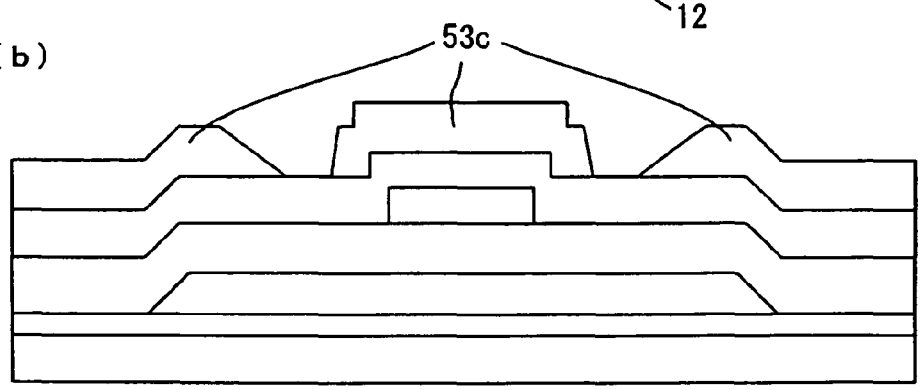
Figure 8:
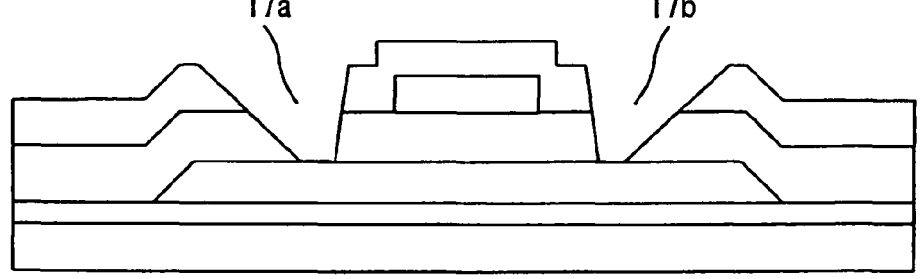
Figure 8:
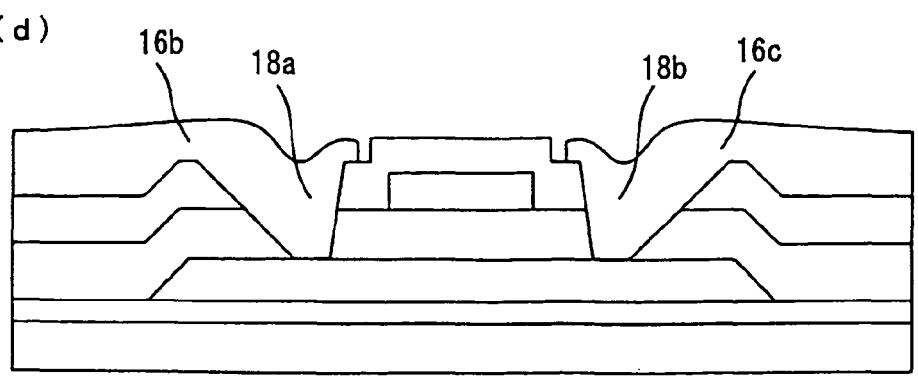
Figure 9:
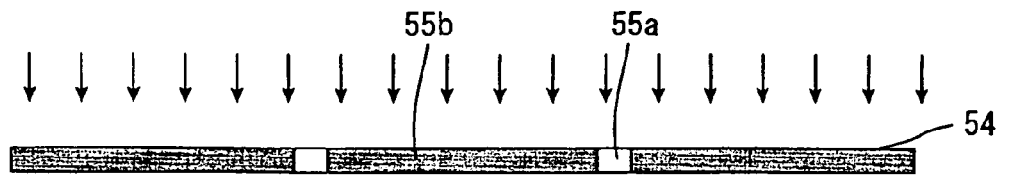
FIGS. 9(a) to 9(d) are cross-sectional views schematically showing production steps of the active matrix substrate in accordance with Comparative Embodiment 1.
Figure 9:
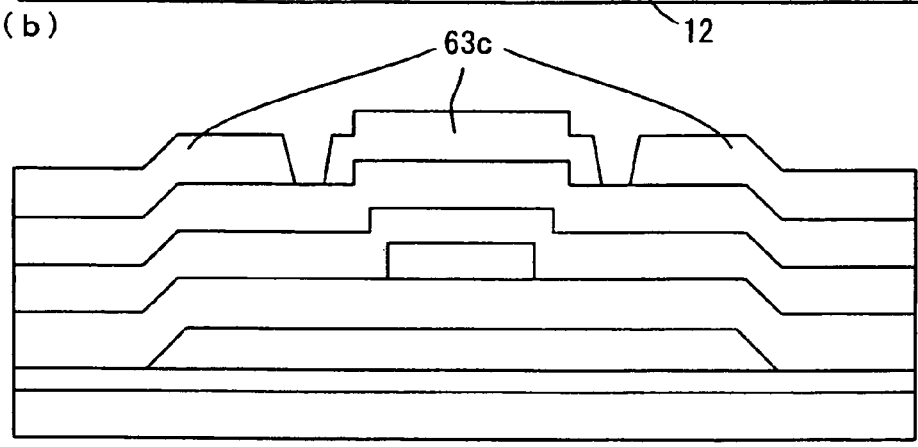
Figure 9:
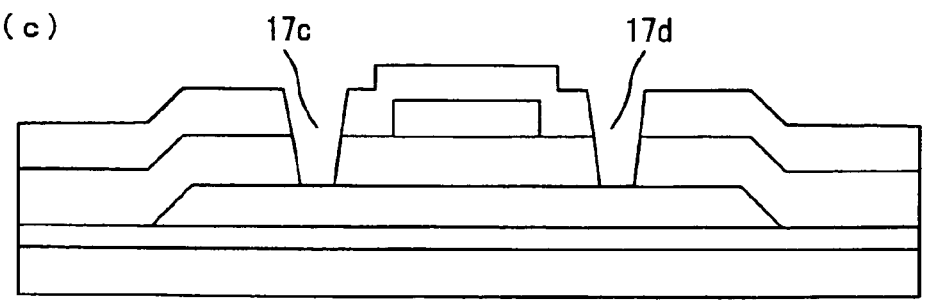
Figure 9:
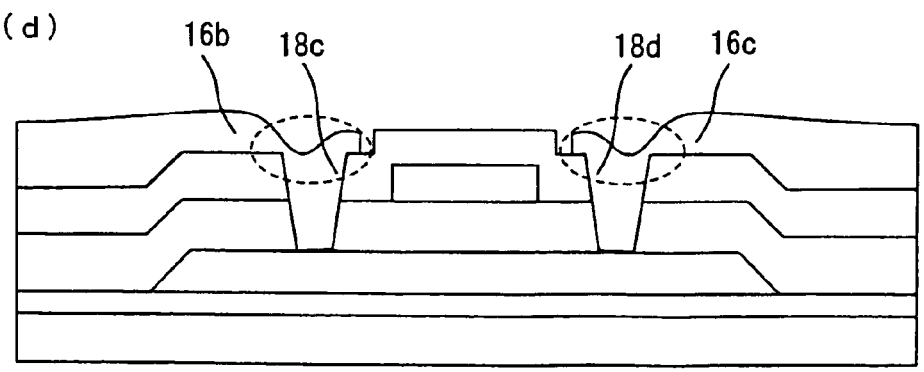
Figure 10:
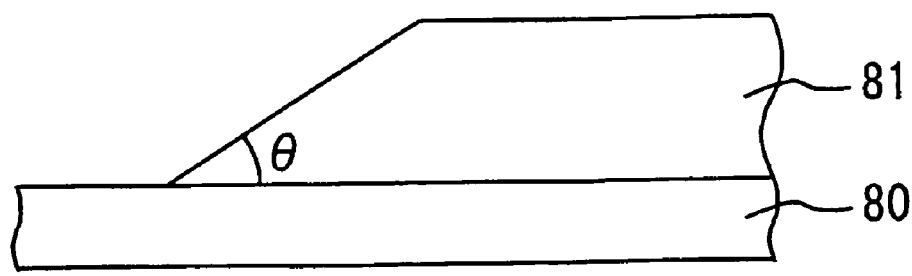
FIG. 10(a) is a cross-sectional view schematically showing a functional layer having a planar side surface.
FIG. 10(b) is a cross-sectional view schematically showing a functional layer having a side surface with a substantially inverted V-shaped cross section.
FIG. 10(c) is a cross-sectional view schematically showing a functional layer having a side surface with a substantially V-shaped cross section. In figures, $\theta$, $\theta 1$, and $\theta 2$ each represent an inclination angle of the side surface.
Figure 10:
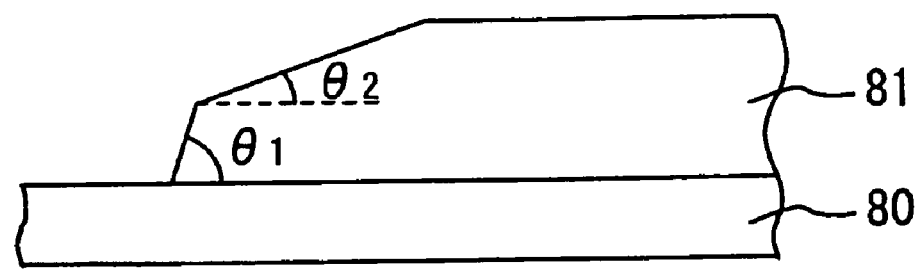
Figure 10:
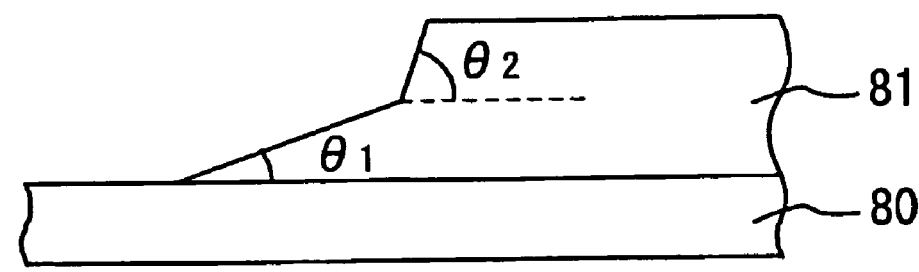
Figure 11:
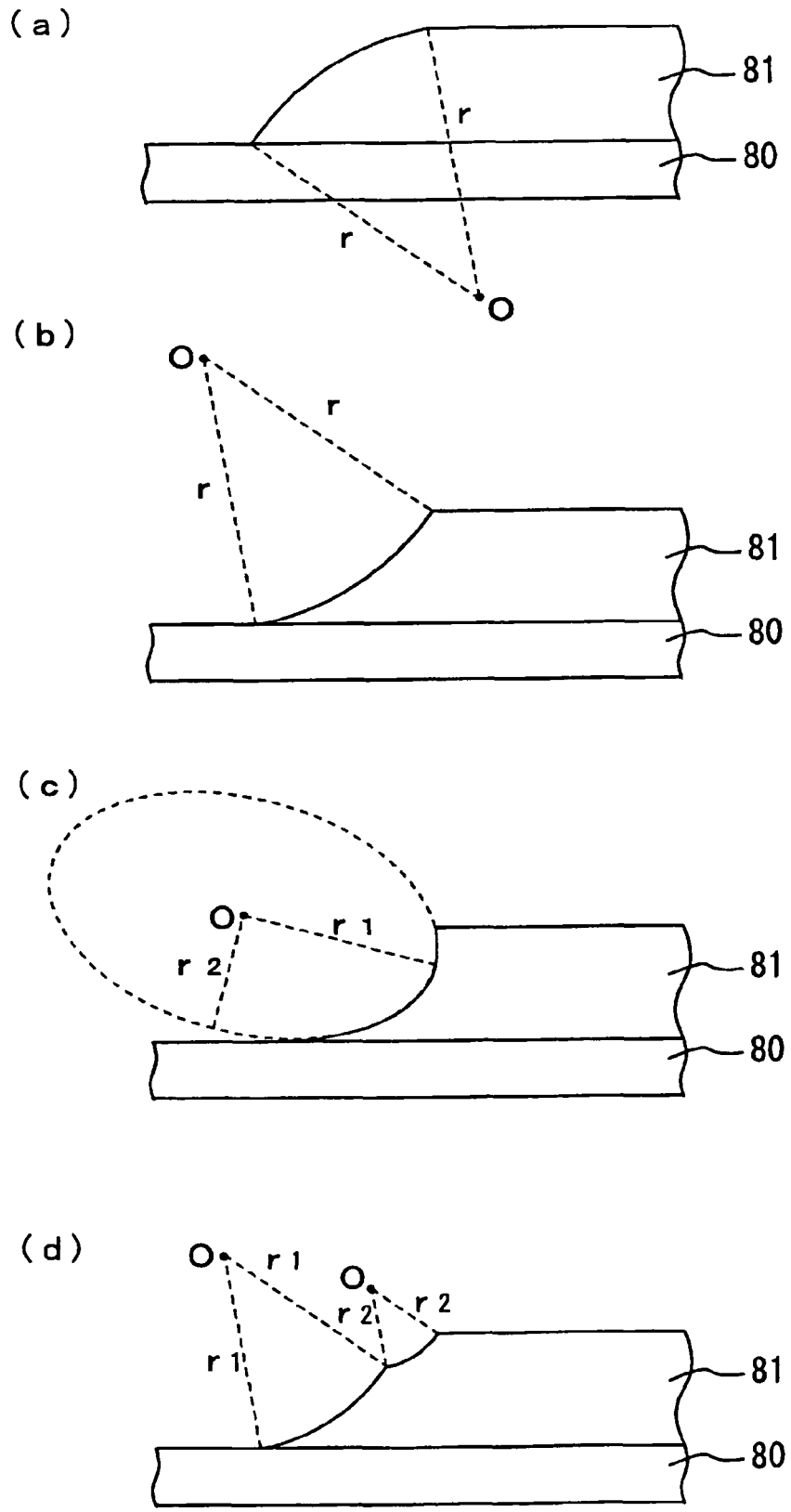
FIG. 11(a) is a cross-sectional view schematically showing a functional layer having an upwardly projecting-curved side surface.
FIG. 11(b) is a cross-sectional view schematically showing a functional layer having a downwardly projecting-curved side surface.
FIG. 11(c) is a cross-sectional view schematically showing a functional layer in which a line profile of the side surface has an ellipse shape when the inclined side surface is viewed from the cross section.
FIG. 11(d) is a cross-sectional view schematically showing a functional layer in which a line profile of a lower side surface and a line profile of an upper side surface have circular shapes with different curvatures when the inclined side surface is viewed from the cross section. In figures, the point O represents the center of the circle or ellipse; r, r1, and r2 (r1≠r2) represents a radius of the circle or a major-axis radius and minor-axis radius of the ellipse.
Figure 12:
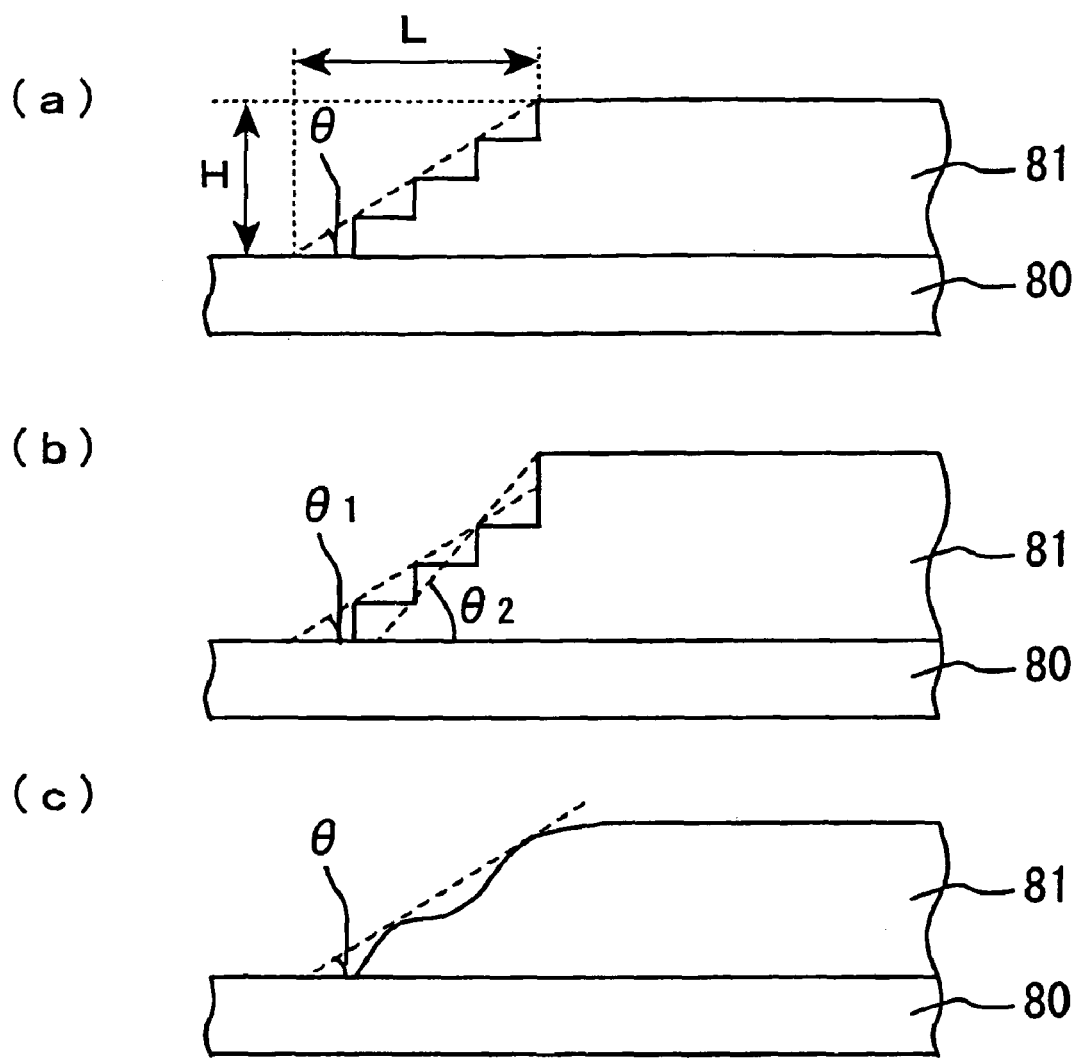
FIG. 12(a) is across-sectional view schematically showing a functional layer having a stepped side surface.
FIG. 12(b) is a cross-sectional view schematically showing a functional layer having a stepped side surface having different inclined angles between the lower part and the upper part.
FIG. 12(c) is a cross-sectional view schematically showing a functional layer having a substantially stepped side surface. In figures, $\theta$, $\theta 1$, and $\theta 2$ each represent an inclination angle of the side surface; H represents a step height; and L represents a step length.

First, as shown in FIG. 8(a), a base coat film 11, a polysilicon layer 12, a gate insulating film (functional film) 13, a gate electrode 16a, an interlayer insulating film (functional film) 14, and a photoresist film 53 are formed on a glass substrate 10. In the present Embodiment, silicon oxide (SiO$_2$) is used as a material for the gate insulating film 13. Also as a material for the interlayer insulating film 14, SiO$_2$ is used. Further, a positive photoresist is used as a material for the photoresist film 53.

Then, the photoresist film 53 is exposed through a mask 54 having a transmissive part 55a, a shaded part 55b, and a gray tone part (exposure control part) 55c. After the exposure, development is performed. As a result, as shown in FIG. 8(b), a photoresist pattern film (covering pattern film) 53c having side surfaces with an inclination angle of 70° and side surfaces with an inclination angle of 85° can be formed.

The interlayer insulating film 14 and the gate insulating film 13 are etched using the photoresist pattern film 53c as a mask. A mixed gas of sulfur hexafluoride (SF$_6$) gas and argon (Ar) gas is used as an etching gas in the present Embodiment. The etching of the interlayer insulating film 14 and the gate insulating film 13 retreats the photoresist pattern film 53c. However, the photoresist pattern film 53c has side surfaces with different inclination angles. Therefore, as shown in FIG. 8(c), holes 17a and 17b each having a side surface with an inclination angle of 60° and a side surface with an inclination angle of 80° can be formed. In the present Embodiment, the side surfaces of the holes 17a and 17b are formed to have an inclination angle of 80° on the gate electrode 16a side and have an inclination angle of 60° on the opposite side.

Finally, as shown in FIG. 8(d), contact holes 18a and 18b, a source electrode 16b, and a drain electrode 16c are formed. As a result, a TFT can be formed.

According to the present Embodiment, the side surfaces of the contact holes 18a and 18b are formed to have an inclination angle of 80° on the gate electrode 16a side. Therefore, the TFT can obtain an excellent fine-processability. In addition, the side surfaces are formed to have an inclination angle of 60° on the opposite side. Therefore, step-cut (disconnection) of the contact holes 18a and 18b can be suppressed.

COMPARATIVE EXAMPLE 1

FIGS. 9(a) to 9(d) are cross-sectional views schematically showing production steps of an active matrix substrate in accordance with Comparative Embodiment 1. The production method in the present Comparative Embodiment is the same as in Embodiment 5, except that the normal mask 54 is used to form a photoresist pattern film 63, and thereby holes 17c and 17d each having side surfaces with an inclination angle of 80° are formed and contact holes 18c and 18d are formed.

In the present Comparative Embodiment, the contact holes 18c and 18d have side surfaces with an inclination angle of 80°. Therefore, if a TFT is finely formed, leakage defects occur between the gate electrode 16a, and the source electrode 16b and the drain electrode 16c. Further, the step coverage can not be sufficiently obtained, and therefore disconnection (step-cut) is generated.

This Nonprovisional application claims priority (under the Paris Convention and the domestic law in the country to be entered into national phase) on Patent Application No. 2005-233460 filed in Japan on Aug. 11, 2005, the entire contents of which are hereby incorporated by reference.

The terms "or more" or "or less" used in the present application include the value described.

EXPLANATION OF NUMERALS AND SYMBOLS 5a, 5b: Side surface of the first photoresist film 53a
5c, 5d: Side surface of the second photoresist film 53b
6a, 6b: Side surface of the polysilicon layer 12
6c, 6d: Side surface of the polysilicon layer 22
10: Glass substrate
11: Base coat film
12, 22: Polysilicon layer
13: Gate insulating film
14: Interlayer insulating film
15: Storage capacitor wiring
16a, 26a: Gate electrode
16b, 26b: Source electrode
16c, 26c: Drain electrode
17a to 17d: Hole
18a to 18d: Contact hole
19: Impurity Ion
32a: High-concentration impurity region
32b: GOLD (gate overlapped lightly doped drain) region
52: Polysilicon film (functional film)
53: Photoresist film (coating film)
53a: First photoresist pattern film (first covering pattern film)
53b: Second photoresist pattern film (second covering pattern film)
53c: Photoresist pattern film (covering pattern film)
53d: Photoresist pattern film
54: Mask
55a: Transmissive part
55b: Shaded part
55c: Exposure control part
56: Opening
63c: Photoresist pattern film
66: Metal film
80: Lower layer of the functional layer 81
81: Functional layer
100: Thin film transistor (TFT) in the pixel circuit part
200: Storage capacitor part
300: TFT in the driver IC (peripheral circuit) part
400 500: TFT

The invention claimed is:

1. A circuit board comprising one or more semiconductor layers at a same layer level, wherein
   the one or more semiconductor layers have differently inclined side surfaces,
   upper surface of each semiconductor layer substantially forms a single plane and the upper surfaces of the one or more semiconductor layers are substantially coplanar with each other,
   lower surface of each semiconductor layer substantially forms a single plane and the lower surfaces of the one or more semiconductor layers are substantially coplanar with each other,
   the one or more semiconductor layers include a first semiconductor layer and a second semiconductor layer,
   the first semiconductor layer has a side surface differently inclined from a side surface of the second semiconductor layer,
   the first semiconductor layer constitutes a thin film transistor in a peripheral circuit, and
   the second semiconductor layer constitutes a thin film transistor in a pixel circuit.

2. The circuit board according to claim 1, wherein at least one of the differently inclined side surfaces has a substantially planar shape.

3. The circuit board according to claim 1, wherein at least one of the differently inclined side surfaces has a substantially stepped shape.

4. The circuit board according to claim 1, wherein
   the first semiconductor layer has a side surface with an inclination angle of 5° or more and 60° or less;
   the second semiconductor layer has a side surface with an inclination angle of 35° or more and 90° or less; and
   the inclination angle of the side surface of the first semiconductor layer is smaller than the inclination angle of the side surface of the second semiconductor layer by 20° or more.

5. The circuit board according to claim 1, wherein
   the first semiconductor layer constitutes a storage capacitor in a pixel circuit; and
   the second semiconductor layer constitutes a thin film transistor in the pixel circuit.

6. The circuit board according to claim 1, wherein
   the first semiconductor layer constitutes a storage capacitor in a pixel circuit; and
   the second semiconductor layer constitutes a thin film transistor in a peripheral circuit.

7. The circuit board according to claim 1, wherein
   the first semiconductor layer constitutes a thin film transistor in a first peripheral circuit; and
   the second semiconductor layer constitutes a thin film transistor in a second peripheral circuit.

8. The circuit board according to claim 1, wherein
   the first semiconductor layer constitutes a first thin film transistor in a peripheral circuit; and
   the second semiconductor layer constitutes a second thin film transistor in the peripheral circuit.

9. The circuit board according to claim 1, wherein the one or more semiconductor layers include a semiconductor layer having differently inclined side surfaces.

10. The circuit board according to claim 9, wherein
the semiconductor layer has a first side surface with an inclination angle of 5° or more and 60° or less and a second side surface with an inclination angle of 35° or more and 90° or less; and
the inclination angle of the first side surface is smaller than the inclination angle of the second side surface by 20° or more.

11. The circuit board according to claim 10, wherein
the semiconductor layer has a storage capacitor electrode part constituting a storage capacitor in a pixel circuit and a transistor part constituting a thin film transistor;
the first side surface is a side surface of the storage capacitor electrode part; and
the second side surface is a side surface of the transistor part.

12. The circuit board according to claim 1, further comprising:
a substrate formed at a substrate layer level; and
one or more gate electrodes formed at a same electrode layer level, wherein
the substrate layer level is below the layer level of the one or more semiconductor layers, and
the electrode layer level is above the layer level of the one or more semiconductor layers.

13. A circuit board comprising one or more gate electrodes at a same layer level, wherein
the one or more gate electrodes include a first gate electrode constituting a thin film transistor in a pixel circuit and a second gate electrode constituting a thin film transistor in a peripheral circuit; and
the first gate electrode has a side surface with an inclination angle larger than an inclination angle of a side surface of the second gate electrode.

14. The circuit board according to claim 13, wherein the first gate electrode and/or the second gate electrode have/has a side surface of a substantially planar shape.

15. The circuit board according to claim 13, wherein the first gate electrode and/or the second gate electrode have/has a side surface of a substantially stepped shape.

16. The circuit board according to claim 13, wherein
the first gate electrode has a side surface with an inclination angle of 50° or more and 90° or less;
the second gate electrode has a side surface with an inclination angle of 20° or more and 60° or less; and
the inclination angle of the side surface of the first gate electrode is larger than the inclination angle of the side surface of the second gate electrode by 20° or more.

17. The circuit board according to claim 13,
wherein an upper surface of the first gate electrode forms a single plane, an upper surface of the second gate electrode forms a single plane, and the upper surfaces of the first and second gate electrodes are substantially coplanar with each other, and
wherein a lower surface of the first gate electrode forms a single plane, a lower surface of the second gate electrode forms a single plane, and the lower surfaces of the first and second gate electrodes are substantially coplanar with each other.

18. The circuit board according to claim 13, further comprising:
a substrate formed at a substrate layer level; and
one or more semiconductor layers formed at a same functional layer level, wherein
the functional layer level is below the layer level of the one or more gate electrodes, and
the substrate layer level is below the functional layer level.

19. A circuit board comprising one or more gate electrodes at a same layer level, wherein
the one or more gate electrodes include a first gate electrode constituting a thin film transistor in a pixel circuit and a second gate electrode constituting a storage capacitor in the pixel circuit; and
the first gate electrode has a side surface with an inclination angle larger than an inclination angle of a side surface of the second gate electrode.

20. The circuit board according to claim 19, wherein the first gate electrode and/or the second gate electrode have/has a side surface of a substantially planar shape.

21. The circuit board according to claim 19, wherein the first gate electrode and/or the second gate electrode have/has a side surface of a substantially stepped shape.

22. The circuit board according to claim 19, wherein
the first gate electrode has a side surface with an inclination angle of 50° or more and 90° or less;
the second gate electrode has a side surface with an inclination angle of 20° or more and 60° or less; and
the inclination angle of the side surface of the first gate electrode is larger than the inclination angle of the side surface of the second gate electrode by 20" or more.

23. The circuit board according to claim 19, further comprising:
a substrate formed at a substrate layer level; and
one or more semiconductor layers formed at a same functional layer level, wherein
the functional layer level is below the layer level of the one or more gate electrodes, and
the substrate layer level is below the functional layer level.

24. A circuit board comprising one or more gate electrodes at a same layer level, wherein
the one or more gate electrodes include a first gate electrode constituting a thin film transistor in a peripheral circuit and a second gate electrode constituting a storage capacitor in a pixel circuit; and
the first gate electrode has a side surface with an inclination angle larger than an inclination angle of a side surface of the second gate electrode.

25. The circuit board according to claim 24, wherein the first gate electrode and/or the second gate electrode have/has a side surface of a substantially planar shape.

26. The circuit board according to claim 24, wherein the first gate electrode and/or the second gate electrode have/has a side surface of a substantially stepped shape.

27. The circuit board according to claim 24, wherein
the first gate electrode has a side surface with an inclination angle of 50° or more and 90° or less;
the second gate electrode has a side surface with an inclination angle of 20° or more and 60° or less; and
the inclination angle of the side surface of the first gate electrode is larger than the inclination angle of the side surface of the second gate electrode by 20° or more.

28. The circuit board according to claim 24, further comprising:
a substrate formed at a substrate layer level; and
one or more semiconductor layers formed at a same functional layer level, wherein
the functional layer level is below the layer level of the one or more gate electrodes, and
the substrate layer level is below the functional layer level.

29. A circuit board comprising one or more gate electrodes at a same layer level, wherein
the one or more gate electrodes include a first gate electrode constituting a thin film transistor in a first peripheral circuit and a second gate electrode constituting a thin film transistor in a second peripheral circuit; and the first gate electrode has a side surface with an inclination angle larger than an inclination angle of a side surface of the second gate electrode.

30. The circuit board according to claim 29, wherein the first gate electrode and/or the second gate electrode have/has a side surface of a substantially planar shape.

31. The circuit board according to claim 29, wherein the first gate electrode and/or the second gate electrode have/has a side surface of a substantially stepped shape.

32. The circuit board according to claim 29, wherein
the first gate electrode has a side surface with an inclination angle of 50° or more and 90° or less;
the second gate electrode has a side surface with an inclination angle of 20° or more and 60° or less; and
the inclination angle of the side surface of the first gate electrode is larger than the inclination angle of the side surface of the second gate electrode by 20° or more.

33. The circuit board according to claim 29,
wherein an upper surface of the first gate electrode forms a single plane, an upper surface of the second gate electrode forms a single plane, and the upper surfaces of the first and second gate electrodes are substantially coplanar with each other, and
wherein a lower surface of the first gate electrode forms a single plane, a lower surface of the second gate electrode forms a single plane, and the lower surfaces of the first and second gate electrodes are substantially coplanar with each other.

34. The circuit board according to claim 29, further comprising:
a substrate formed at a substrate layer level; and
one or more semiconductor layers formed at a same functional layer level, wherein
the functional layer level is below the layer level of the one or more gate electrodes, and
the substrate layer level is below the functional layer level.

35. A circuit board comprising one or more gate electrodes at a same layer level, wherein
the one or more gate electrodes include a first gate electrode constituting a first thin film transistor in a peripheral circuit and a second gate electrode constituting a second thin film transistor in the peripheral circuit; and
the first gate electrode has a side surface with an inclination angle larger than an inclination angle of a side surface of the second gate electrode.

36. The circuit board according to claim 35, wherein the first gate electrode and/or the second gate electrode have/has a side surface of a substantially planar shape.

37. The circuit board according to claim 35, wherein the first gate electrode and/or the second gate electrode have/has a side surface of a substantially stepped shape.

38. The circuit board according to claim 35, wherein
the first gate electrode has a side surface with an inclination angle of 50° or more and 90° or less;
the second gate electrode has a side surface with an inclination angle of 20° or more and 60° or less; and
the inclination angle of the side surface of the first gate electrode is larger than the inclination angle of the side surface of the second gate electrode by 20° or more.

39. The circuit board according to claim 35,
wherein an upper surface of the first gate electrode forms a single plane, an upper surface of the second gate electrode forms a single plane, and the upper surfaces of the first and second gate electrodes are substantially coplanar with each other, and
wherein a lower surface of the first gate electrode forms a single plane, a lower surface of the second gate electrode forms a single plane, and the lower surfaces of the first and second gate electrodes are substantially coplanar with each other.

40. The circuit board according to claim 35, further comprising:
a substrate formed at a substrate layer level; and
one or more semiconductor layers formed at a same functional layer level, wherein
the functional layer level is below the layer level of the one or more gate electrodes, and
the substrate layer level is below the functional layer level.

41. A circuit board comprising:
one or more gate electrodes at a same layer level;
a substrate formed at a substrate layer level; and
one or more semiconductor layers formed at same functional layer level, wherein
the one or more gate electrodes include a gate electrode having differently inclined side surfaces,
the functional layer level is below the layer level of the one or more gate electrodes, and
the substrate layer level is below the functional layer level.

42. The circuit board according to claim 41, wherein
the gate electrode has a first side surface with an inclination angle of 50° or more and 90° or less and a second side surface with an inclination angle of 20° or more and 60° or less; and
the inclination angle of the first side surface is larger than the inclination angle of the second side surface by 20° or more.

43. An electronic device comprising the circuit board of claim 1.

44. The electronic device according to claim 43, wherein the electronic device is a liquid crystal display device.

45. The electronic device according to claim 43, wherein the electronic device is an organic electroluminescent display device.

46. A method for producing a circuit board, the method comprising the steps of:
forming one or more covering pattern films having differently inclined side surfaces on a functional film; and
forming one or more functional layers by etching the functional film, wherein
the one or more functional layers are at a same layer level,
the functional film is a semiconductor film such that the one or more functional layers are one or more semiconductor layers,
upper surface of each semiconductor layer substantially forms a single plane and the upper surfaces of the one or more semiconductor layers are substantially coplanar with each other, and
lower surface of each semiconductor layer substantially forms a single plane and the lower surfaces of the one or more semiconductor layers are substantially coplanar with each other,
wherein the method further comprises:
forming a substrate at a substrate layer level; and
forming one or more gate electrodes at a same electrode layer level,
wherein
the substrate layer level is below the layer level of the one or more semiconductor layers, and
the electrode layer level is above the layer level of the one or more semiconductor layers.

47. The method for producing the circuit board according to claim 46, wherein the step of forming the one or more functional layers is performed using the one or more covering pattern films.

48. The method for producing the circuit board according to claim 46, wherein
the one or more covering pattern films include a first covering pattern film and a second covering pattern film; and
the first covering pattern film has a side surface differently inclined from a side surface of the second covering pattern film.

49. The method for producing the circuit board according to claim 46, wherein the one or more covering pattern films include a covering pattern film having differently inclined side surfaces.

50. The method for producing the circuit board according to claim 46, wherein the step of forming the one or more covering pattern films includes one-time exposure for a photoresist film through a mask.

51. The method for producing the circuit board according to claim 50, wherein
the mask includes a transmissive part, a shaded part, and an exposure control part; and
the exposure control part is disposed between the transmissive part and the shaded part.

52. The method for producing the circuit board according to claim 46, wherein the step of forming the one or more functional layers is performed by dry etching.

* * * * *